United States Patent
Chang et al.

(10) Patent No.: US 8,338,962 B2
(45) Date of Patent: Dec. 25, 2012

(54) SEMICONDUCTOR PACKAGE SUBSTRATE AND SEMICONDUCTOR PACKAGE HAVING THE SAME

(75) Inventors: Won-gi Chang, Jecheon-si (KR); Tae-sung Park, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/072,746

(22) Filed: Mar. 27, 2011

(65) Prior Publication Data

US 2012/0038035 A1   Feb. 16, 2012

(30) Foreign Application Priority Data

Aug. 12, 2010   (KR) ................ 10-2010-0077815

(51) Int. Cl.
*H01L 23/48* (2006.01)

(52) U.S. Cl. . 257/777; 257/670; 257/686; 257/E25.005; 257/E25.006; 257/E25.013; 257/E25.021; 257/E25.027; 257/E23.085

(58) Field of Classification Search .......... 257/666–677, 257/E23.031, E23.059, 777, 723, 686, E25.005, 257/E25.006, E25.013, E25.021, E25.027, 257/E23.085

See application file for complete search history.

(56) References Cited

U.S. PATENT DOCUMENTS

| 6,713,857 | B1 * | 3/2004 | Tsai ............................... 257/686 |
| 7,884,460 | B2 * | 2/2011 | Yim et al. ...................... 257/686 |
| 2007/0241442 | A1 | 10/2007 | Ha et al. |
| 2009/0256249 | A1 | 10/2009 | Yu et al. |

FOREIGN PATENT DOCUMENTS

| JP | 2009-158739 | 7/2009 |
| KR | 1020070038798 A | 4/2007 |
| KR | 1020080002449 A | 1/2008 |
| KR | 1020080013937 A | 2/2008 |
| KR | 1020080070097 A | 7/2008 |
| KR | 1020080090268 A | 10/2008 |

* cited by examiner

*Primary Examiner* — Jasmine Clark
(74) *Attorney, Agent, or Firm* — Renaissance IP Law Group LLP

(57) ABSTRACT

A semiconductor package may include a package substrate having a first surface and a boundary that may be defined by edges of the package substrate. The package further includes a first semiconductor chip having a front surface and a back surface. The back surface of a first portion of the first semiconductor chip may be disposed on the first surface of the package substrate with the back surface of a second portion of the first semiconductor chip extending beyond of the defined boundary of the package substrate. The semiconductor package may also include a second semiconductor chip disposed on the back surface of the second portion of the first semiconductor chip that extends beyond the defined boundary of the package substrate.

29 Claims, 24 Drawing Sheets

SEMICONDUCTOR PACKAGE SUBSTRATE AND SEMICONDUCTOR PACKAGE HAVING THE SAME

CROSS-REFERENCE TO RELATED APPLICATIONS

This application claims the benefit of Korean Patent Application No. 10-2010-0077815, filed on Aug. 12, 2010, in the Korean Intellectual Property Office, the disclosure of which is incorporated herein in its entirety by reference.

BACKGROUND

The inventive concept generally relates to a semiconductor package substrate, and a semiconductor package having the same.

Today, there is an ever-increasing demand for electronic devices that are both smaller in size and have larger data processing capability. While various methods have already been suggested to increase the integration and data processing capacity of semiconductor devices used in such electronic devices, they come with a number of problems and disadvantages, such as data instability and unreliability in the semiconductor devices.

SUMMARY

In one embodiment, a semiconductor package includes a package substrate having a first surface and a boundary that may be defined by edges of the package substrate. The package further includes a first semiconductor chip having a front surface and a back surface. The back surface of a first portion of the first semiconductor chip may be disposed on the first surface of the package substrate with the back surface of a second portion of the first semiconductor chip extending beyond the defined boundary of the package substrate. The semiconductor package may also include a second semiconductor chip disposed on the back surface of the second portion of the first semiconductor chip that extends beyond the defined boundary of the package substrate.

In some embodiments, the package substrate may be a die paddle of a lead frame. In another embodiment, the package substrate may be a printed circuit board (PCB) substrate.

With such aspects, the overall thickness and volume of a semiconductor package can be reduced especially when multiple semiconductor chips are included in a semiconductor package.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
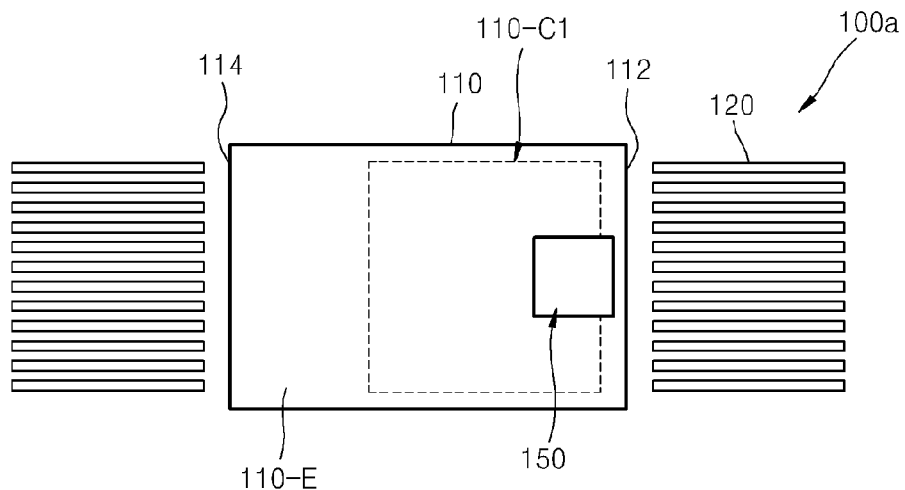
FIGS. 1 through 5 are plan views showing lead frames according to embodiments of the inventive concept.

Semiconductor packages and lead frames according to embodiments of the inventive concept will now be described more fully with reference to the accompanying drawings, in which exemplary embodiments of the inventive concept are shown. However, it will be understood by those skilled in the art that various changes in form and details may be made therein without departing from the spirit and scope of the inventive concept as defined by the appended claims. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 45A:
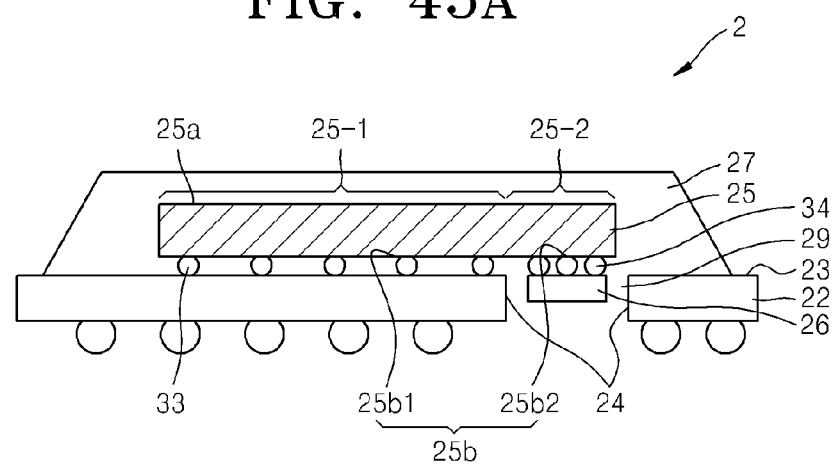
FIG. 45A is a somewhat schematic cross-sectional view of a semiconductor package according to some embodiments.
Figure 45B:
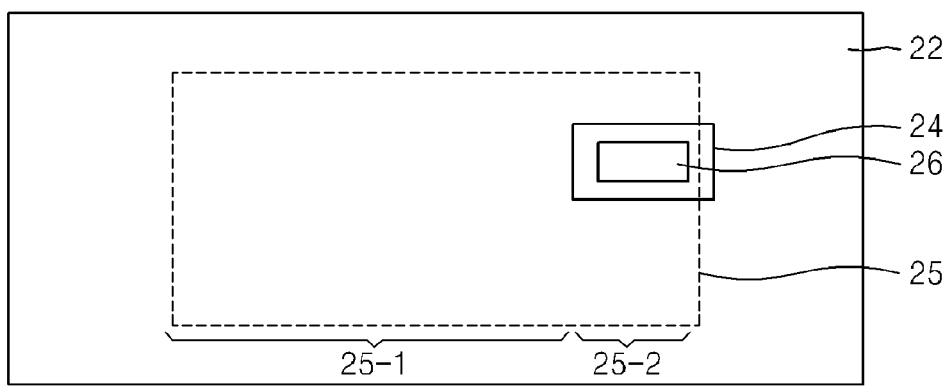
FIG. 45B is a somewhat schematic illustration showing certain components of the semiconductor package of FIG. 45A in plan view to illustrate additional aspects of some embodiments.

FIGS. 45A and 45B are a part of a semiconductor package structure illustrating some embodiments of the inventive concept. For example, a semiconductor package 2 includes a package substrate 22 having a first surface 23 and a defined boundary 24. For example, the boundary 24 may be defined by edges of the package substrate 22. More particularly, the boundary 24 may be defined by edges formed around an opening 29 such as a through-hole or notch (e.g., a notch formed in a perimeter of the package substrate 22) extending through the package substrate 22 as will be explained further below.

Figure 41:
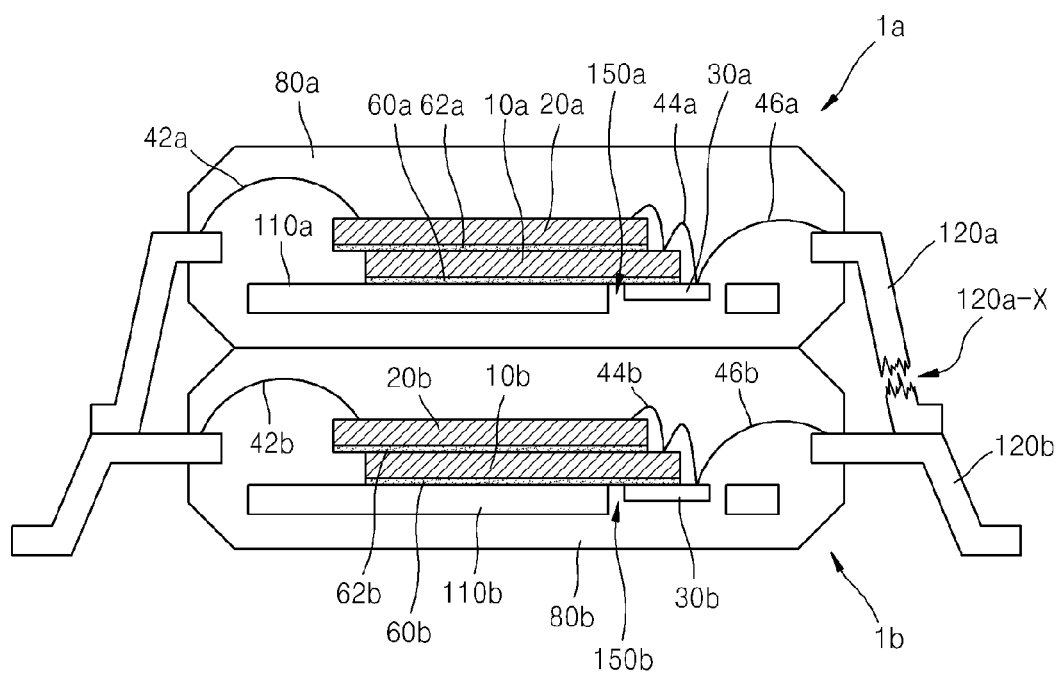
FIG. 41 is a sectional view of a semiconductor package according to a tenth embodiment of the inventive concept.
Figure 42:
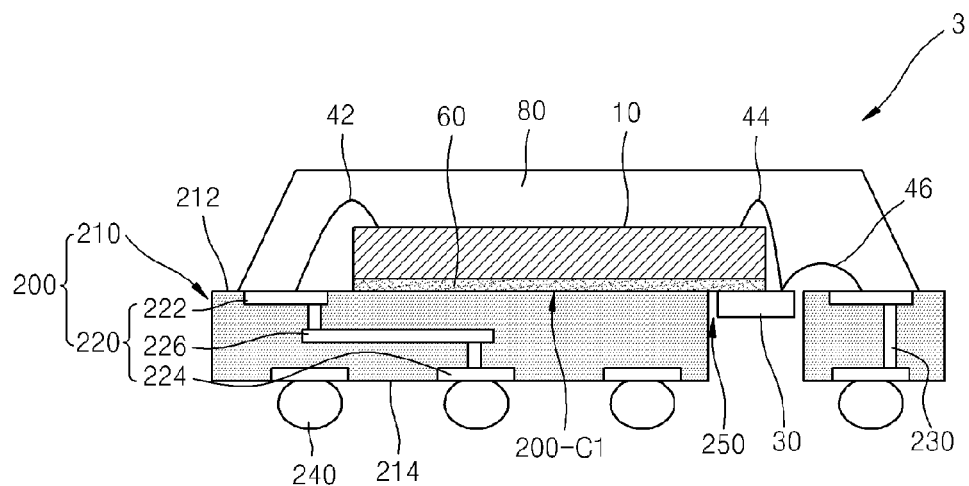
FIG. 42 is a sectional view of a semiconductor package according to an eleventh embodiment of the inventive concept.

In some embodiments, the package substrate 22 may be a printed circuit board (PCB) substrate as shown in FIG. 42 and FIG. 45A-45B, for example. Alternatively, the package substrate 22 may be a die paddle of a lead frame. Some example die paddle structures are shown in FIGS. 1-41.

In addition, the semiconductor package 2 may include a first semiconductor chip 25 having a front surface 25a and a back surface 25b. The back surface 25b may include a back surface 25b1 of a first portion 25-1 of the first semiconductor chip 25 and a back surface 25b2 of a second portion 25-2 of the first semiconductor chip 25. The back surface 25b1 of the first portion 25-1 of the first semiconductor chip 25 may be disposed on a portion of the first surface 23 of the package substrate 22. On the other hand, the back surface 25b2 of the second portion 25-2 of the first semiconductor chip 25 may extend beyond the defined boundary 24 of the package substrate 22 as illustrated in FIGS. 45A-45B, for example.

If the edges that form the defined boundary 24 are formed around a through hole extending through the package substrate 22, then the back surface 25b2 may extend beyond a portion of the defined boundary 24 as shown in FIG. 45B. If the defined boundary 24 is defined by outer edges of the package substrate 22 or by a notch arranged in a perimeter of the package substrate 22, the back surface 25b2 of the first semiconductor chip 25 may extend past outer edges of the package substrate 22 as shown in FIG. 45C.

Figure 45C:
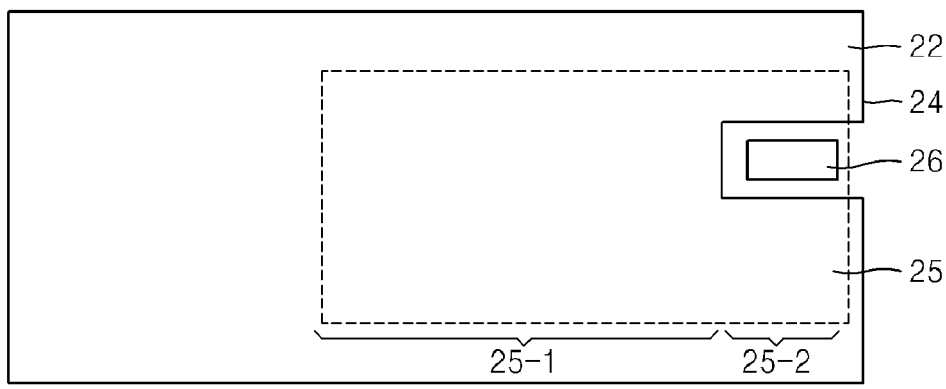
FIG. 45C is an additional schematic illustration of certain components of a semiconductor package shown in plan view to illustrate aspects of alternative embodiments.

The semiconductor package 2 may also include a second semiconductor chip 26 disposed on a region of the back surface 25b2 of the second portion 25-2 of the first semiconductor chip 25 that extends past the defined boundary 24 of the package substrate 22 and is exposed through the package substrate 22 as shown in FIGS. 45B through 45C.

The resulting structure may be housed in a molding compound such as an epoxy molding compound 27. However, other suitable encapsulants or equivalent structures may also be used to house the resulting structure to form a semiconductor package.

Also, the semiconductor chips 25, 26 may be connected to semiconductor packages through various connection methods such as wire bonding or flip chip technologies. In FIG. 45A, the first semiconductor chip 25 may be coupled to the semiconductor package substrate 22 through conductive bumps 33 and the second semiconductor chip 26 is coupled to the back surface 25b of the second portion 25-2 of the first semiconductor chip 25 through conductive bumps or interchip connection terminals 34 or the like.

In addition, although not shown in FIG. 45A, one or more additional semiconductor chips can be stacked on the first semiconductor chip 25 or second semiconductor chip 26.

In some embodiments, although not illustrated, an underfill structure may be disposed between the first semiconductor chip 24 and the package substrate 22 to provide bump protection and reach high reliability performance.

Accordingly, embodiments of the present application may include a semiconductor package structure where a semiconductor chip is attached on a portion of a back surface of another semiconductor chip that is exposed through an opening such as a notch or a through-hole of a semiconductor package substrate, or beyond an edge of a semiconductor package substrate.

As a result, the overall thickness and volume of a semiconductor package can be reduced, especially when multiple semiconductor chips can be included in a semiconductor package.

FIGS. 1 through 5 are plan views showing lead frames according to some embodiments of the inventive concept. In describing the lead frames according to embodiments of the inventive concept shown in FIGS. 1 through 5, any redundant explanations may be omitted.

FIG. 1 is a plan view of a lead frame 100a according to an embodiment of the inventive concept.

Referring to FIG. 1, the lead frame 100a includes a die paddle 110 and a plurality of leads 120, which are arranged around the die paddle 110. An opening, in this case, a through hole 150 is formed in the die paddle 110. The lead frame 100a may be formed of a metal such as copper.

The die paddle 110 may have a rectangular shape as shown in FIG. 1. However, the die paddle 110 may have a different shape according to the shape, type, and number of semiconductor chips (not shown) to be attached on the die paddle 110. The die paddle 110 may include a semiconductor chip attaching region 110-C1, to which a semiconductor chip described below (or a first semiconductor chip) and a peripheral region 110-E, which surrounds the semiconductor chip attaching region 110-C1.

Here, the semiconductor chip refers to the first semiconductor chip attached on the die paddle 110. Therefore, if a plurality of semiconductor chips are stacked on the die paddle 110, the semiconductor chip refers to the bottommost semiconductor chip, which is closest to the die paddle 110.

As shown in FIG. 1, the plurality of leads 120 may be arranged adjacent to a first edge 112 and a second edge 114, which are two opposite edges of the die paddle 110. Alternatively, the plurality of leads 120 may be arranged adjacent all edges of the die paddle 110, for example in FIG. 2.

In the lead frame 100a prior to fabrication of a semiconductor package, the die paddle 110 and the plurality of leads 120 may be connected to each other. However, after a semiconductor package is fabricated using the lead frame 100a, the die paddle 110 and the plurality of leads 120 may be cut and separated from each other.

The opening 150 may be a through hole formed in the die paddle 110. In this case, the opening 150 may be formed through the die paddle 110 with the boundary of the opening 150 being spaced apart from the perimeter of the die paddle 110. The opening 150 may be arranged adjacent the first edge 112 of the die paddle 110. In other words, the opening 150 may be arranged close to a part of the leads 120 that are arranged near the first edge 112. The opening 150 may be formed to be slightly larger than the size of an assistant semiconductor chip described below. That is, the area of the top surface of the assistant semiconductor chip may be smaller than the area of the opening 150, so that the assistant semiconductor chip may be easily inserted into the opening 150. Here, the top surface of the assistant semiconductor chip refers to an active surface, on which individual electronic devices are formed, of the two opposite surfaces of the assistant semiconductor chip.

The opening 150 may extend between both the semiconductor chip attaching region 110-C1 and the peripheral region 110-E. Therefore, a portion of the assistant semiconductor chip inserted into the opening 150 and extending beyond the semiconductor chip attached on the semiconductor chip attaching region 110-C1 may be exposed.

Figure 6:
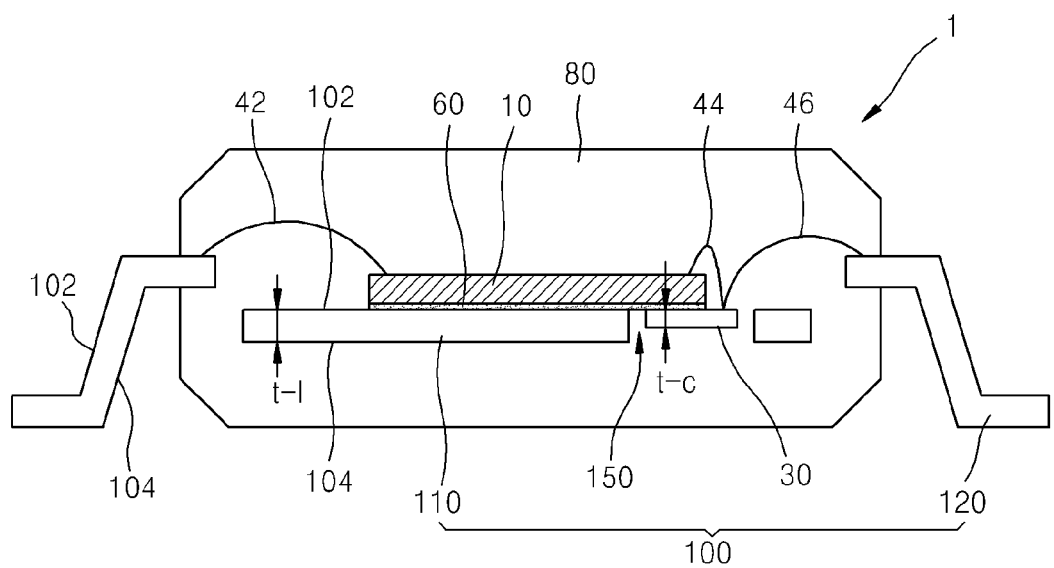
FIGS. 6 through 9 are sectional views of semiconductor packages according to a first embodiment of the inventive concept.

A portion of the plurality of leads 120, e.g., the lead 120 adjacent the opening 150, may be electrically connected to the assistant semiconductor chip through a bonding wire as shown in, for example, FIG. 6. Therefore, the location of the opening 150 in the die paddle 110 may be determined based on the arrangement of the lead 120 electrically connected to the assistant semiconductor chip through a bonding wire.

Figure 2:
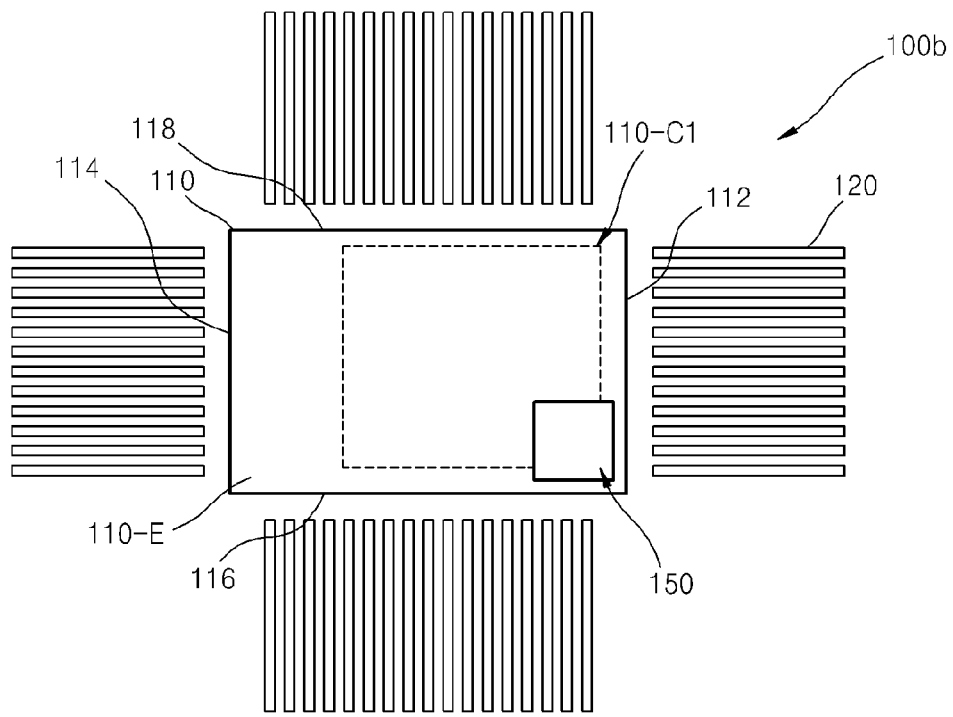

FIG. 2 is a plan view of a lead frame 100b according to another embodiment of the inventive concept.

Referring to FIG. 2, the lead frame 100b includes the die paddle 110 and the plurality of leads 120, which are arranged around the die paddle 110. The die paddle 110 may include the first edge 112 and the second edge 114 opposite the first edge 112, and a third edge 116 and a fourth edge 118, which are opposite each other, connecting the first edge 112 and the second edge 114.

The plurality of leads 120 may be arranged adjacent to the first edge 112, the second edge 114, the third edge 116, and the fourth edge 118, for fabrication of a quad flat package (QFP).

The opening 150 may be arranged close to the first edge 112 and the third edge 116, which is adjacent to the first edge 112, of the die paddle 110. In other words, if the die paddle 110 has a rectangular shape, the opening 150 may be arranged close to a corner of the die paddle 110. In this case, an assistant semiconductor chip to be inserted into the opening 150 may be electrically connected to the leads 120 close to the first edge 112 and the third edge 116 through a bonding wire.

Figure 3:
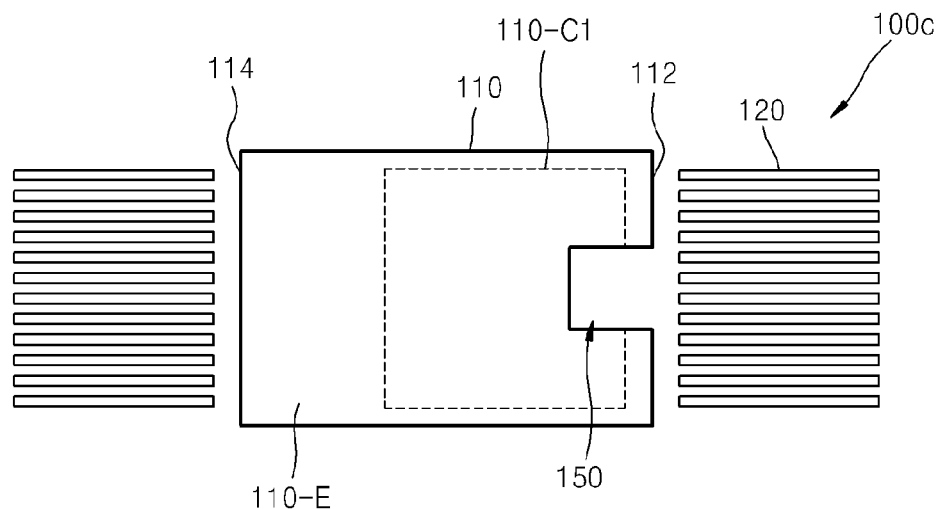

FIG. 3 is a plan view of a lead frame 100c according to another embodiment of the inventive concept.

Referring to FIG. 3, the lead frame 100c includes the die paddle 110 and the plurality of leads 120, which are arranged around the die paddle 110. In this embodiment, the opening 150 is a notch arranged in a perimeter of the die paddle 110. The opening 150 may extend inward from the first edge 112 of the die paddle 110 towards a center of the die paddle 110.

Comparing the lead frame 100a of FIG. 1 to the lead frame 100c of FIG. 3, the opening 150 shown in FIG. 1 is a through hole formed in the die paddle 110, whereas the opening 150 shown in FIG. 3 is a notch extending inward from the first edge 112 of the die paddle 110. Similarly, although not shown, the opening 150 shown in FIG. 2 may be modified to extend from both the first edge 112 and the third edge 116 of the die paddle 110. In other words, the opening 150 could also be a notch formed in a corner of the die paddle 110.

Figure 4:
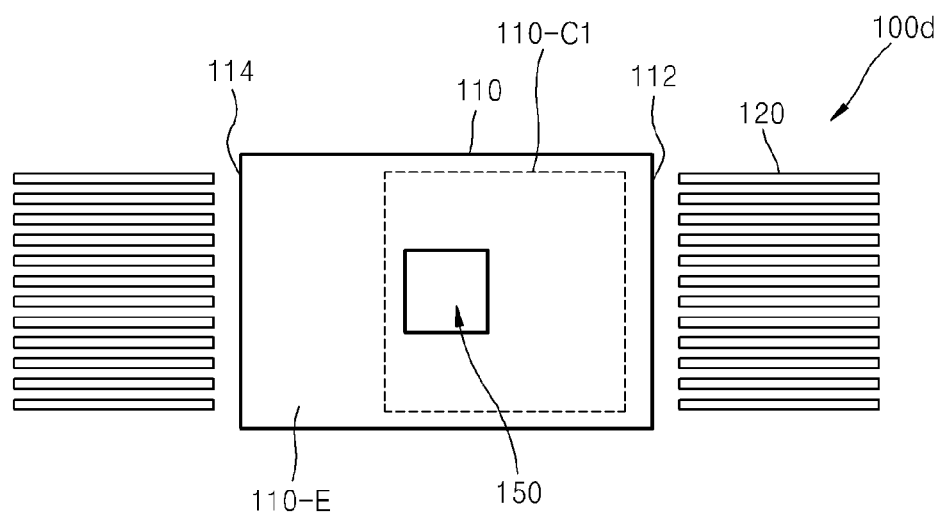

FIG. 4 is a plan view of a lead frame 100d according to another embodiment of the inventive concept.

Referring to FIG. 4, the lead frame 100d includes the die paddle 110 and the plurality of leads 120, which are arranged around the die paddle 110. The opening 150 is formed in the die paddle 110. The opening 150 may be a through-hole formed in the die paddle 110.

Referring to FIGS. 1 through 4, unlike in the lead frames 100a, 100b, and 100c shown in FIGS. 1 through 3, the opening 150 may be formed at the center of the die paddle 110 in the lead frame 100d shown in FIG. 4. In other words, the opening 150 shown in FIG. 4 may be arranged entirely within the semiconductor chip attaching region 110-C1 of the die paddle 110.

As described below, in the lead frames 100a, 100b, and 100c shown in FIGS. 1 through 3, only a portion of the opening 150 may be covered by a semiconductor chip (not shown) and the remaining portion of the opening 150 may be exposed when the semiconductor chip is attached on the die paddle 110. However, in the lead frame 100d shown in FIG. 4, the entire opening 150 may be covered by a semiconductor chip (not shown) when the semiconductor chip is attached on the die paddle 110.

Figure 5:
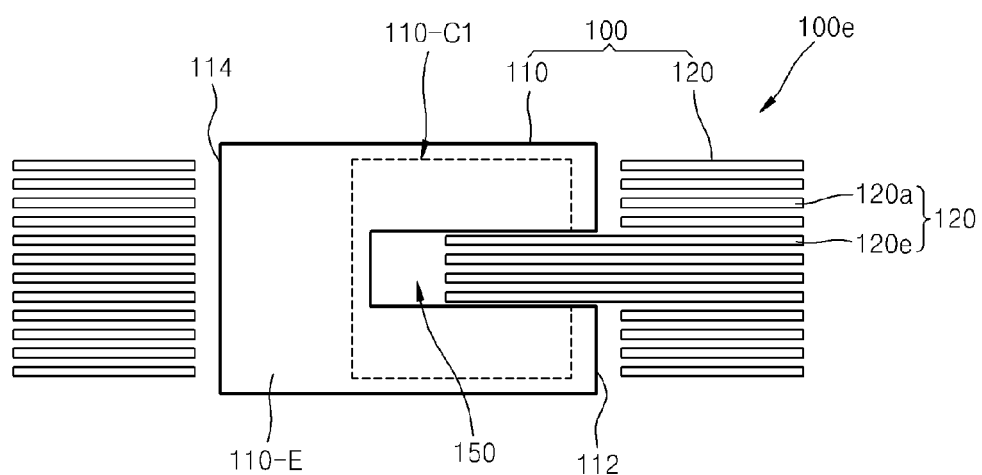

FIG. 5 is a plan view of a lead frame 100e according to another embodiment of the inventive concept.

Referring to FIG. 5, the lead frame 100e includes the die paddle 110 and the plurality of leads 120, which are arranged around the die paddle 110. The opening 150 is formed in the die paddle 110. The opening 150 may be a notch extending inward from the first edge 112 of the die paddle 110.

Referring to FIGS. 3 through 5, unlike in the lead frame 100c shown in FIG. 3, the opening 150 shown in FIG. 5 may extend to further inward toward or past the center of the die paddle 110 in the lead frame 100e. Furthermore, while the opening 150 in the embodiment shown in FIG. 4 is a through-hole formed in the die paddle 110 in the lead frame 100d, the opening 150 of this embodiment has a recessed shape extending inward from the first edge 112 with a portion 120e of the plurality of leads 120 extending into the opening 150 in the lead frame 100e shown in FIG. 5.

From among the plurality of leads 120, each of the leads extending into the opening 150 may be referred to as a long lead 120e, and each of the remaining of the plurality of leads 120 may be referred to as a short lead 120a. Here, the term "long" and "short" used with the leads 120 do not indicate absolute lengths of each of the lead 120, but indicate whether each of the leads 120 extends into the opening 150 or not.

Hereinafter, semiconductor packages employing the lead frames 100a, 100b, 100c, 100d, and 100e shown in FIGS. 1 through 5 will be shown and described. However, each of the semiconductor devices may selectively employ all of or a part of the lead frames 100a, 100b, 100c, 100d, and 100e shown in FIGS. 1 through 5 and are not limited to shapes of the lead frames 100a, 100b, 100c, 100d, and 100e shown in FIGS. 1 through 5.

FIGS. 6 through 9 are sectional views of semiconductor packages according to an embodiment of the inventive concept. FIG. 6 shows a semiconductor package employing a lead frame as shown in FIG. 1 or FIG. 2, and FIGS. 7 through 9 show semiconductor packages employing lead frames as shown in FIGS. 3 through 5, respectively. In describing the semiconductor packages according to some embodiments, redundant explanations may be omitted.

FIG. 6 is a sectional view showing a semiconductor package 1 according to an embodiment of the inventive concept.

Referring to FIG. 6, the semiconductor package 1 includes a lead frame having the die paddle 110 in which the opening 150 is formed, the plurality of leads 120, and a semiconductor chip 10 attached on a first surface 102 of the lead frame, that is, on the first surface 102 of the die paddle 110.

The semiconductor chip 10 may be attached on the die paddle 110 to partially cover the opening 150. The semiconductor chip 10 may be attached on the die paddle 100, such that an active surface, on which individual electronic devices are formed, faces a direction opposite to the die paddle 110. An assistant semiconductor chip 30 is attached on the semiconductor chip 10 through the opening 150. In other words, the assistant semiconductor chip 30 may be attached on a surface of the semiconductor chip 10 exposed through the opening 150 and facing the die paddle 10, that is, facing a direction opposite to the active surface of the semiconductor chip 10.

The assistant semiconductor chip 30 may be arranged to extend between a portion of the opening 150 not covered by the semiconductor chip 10 and a portion of the opening 150 covered by the semiconductor chip 10. In other words, the assistant semiconductor chip 30 may be arranged such that the assistant semiconductor chip 30 is partially exposed through the opening 150.

Furthermore, a bonding pad (not shown) for electrically connecting the assistant semiconductor chip 30 to the outside may be formed on the portion of the assistant semiconductor chip 30 exposed through the opening 150. In this case, an active surface of the assistant semiconductor chip 30, on which individual electronic devices are formed, may face the semiconductor chip 10. The bonding pad (not shown) may be used to connect to a bonding wire described below.

The semiconductor chip 10 or the assistant semiconductor chip 30 may be formed by back lapping or back grinding wafers on which semiconductor devices are formed and by dicing the wafers into individual dies.

A first thickness t-c, which is the thickness of the assistant semiconductor chip 30, may be smaller than or equal to a second thickness t-1, which is the thickness of the lead frame including the die paddle 110. For example, when the second thickness t-1 is 125 nm, the first thickness t-c may be from about 60 μm to about 125 μm. In other words, the assistant semiconductor chip 30 may have a thickness smaller than or equal to the second thickness t-1 during the back lapping or back grinding.

Therefore, the assistant semiconductor chip 30 may be housed in a space located within the opening 150. In other words, the assistant semiconductor chip 30 may not protrude with respect to a second surface 104 of the die paddle 110. Therefore, the overall thickness of the semiconductor package 1 may not increase even with the addition of the assistant semiconductor chip 30.

Here, the entire first surface 102 or the second surface 104 of the lead frame may not be oriented on a same surface. In other words, while portions of the first surface 102 or the second surface 104 of the lead frame corresponding to the die paddle 110 may be oriented on a same surface, other portions of the first surface 102 or the second surface 104 may be oriented on a different surface. The first surface 102 or the second surface 104 of the lead frame may be initially oriented on the same surface when the lead frame is fabricated. However, during fabrication of the semiconductor package 1, the lead frame, and more particularly, the leads 120 may be bent if required. Therefore, the first surface 102 and the second surface 104 of the lead frame may refer to surfaces that used be on the same surface when the lead frame was initially fabricated.

The semiconductor chip 10 may be attached on the die paddle 110 using an adhesive, such as an adhesive layer 60, a die attach film, die attach paste or the like. For example, in the case where the semiconductor chip 10 is attached through the adhesive layer 60, such as a die attach film, the adhesive layer 60 may be formed to cover a surface of the semiconductor chip 10 facing the die paddle 110.

In this case, the assistant semiconductor chip 30 may be attached to the semiconductor chip 10 through a portion of the adhesive layer 60 adhered to the semiconductor chip 10 and exposed through the opening 150. Therefore, the assistant semiconductor chip 30 may be attached on the semiconductor chip 10 without a separate adhesive material.

The semiconductor chip 10, the assistant semiconductor chip 30, and the leads 120 may be electrically connected to each other through bonding wires 42, 44, and 46 interposed therebetween. The bonding wires 42, 44, and 46 may be directly connected to bonding pads (not shown) formed on active surfaces of the semiconductor chip 10 and the assistant semiconductor chip 30. In other words, although not shown, bonding pads may be formed on portions of the semiconductor chip 10 and the assistant semiconductor chip 30 to which the bonding wires 42, 44, and 46 are attached.

The bonding wires 42, 44, and 46 may contain gold, for example. For the sake of convenience, the bonding wires 42, 44, and 46 may be respectively described as the first bonding wire 42 interconnecting the semiconductor chip 10 and the lead 120, the second bonding wire 44 interconnecting the semiconductor chip 10 and the assistant semiconductor chip 30, and the third bonding wire 46 interconnecting the assistant semiconductor chip 30 and the lead 120.

However, the bonding wires 42, 44, and 46 may be arranged in different manners for operations of the semiconductor chip 10 and the assistant semiconductor chip 30. In other words, as long as the bonding wires 42, 44, and 46 maintain electrical connections between the semiconductor chip 10, the assistant semiconductor chip 30, and the lead 120, the bonding wires 42, 44, and 46 may be arranged in various manners.

The third bonding wire 46, which electrically interconnects the assistant semiconductor chip 30 and the lead 120, may be formed on the first surface 102 of the lead frame. In other words, the third bonding wire 46 may be connected to a portion of the assistant semiconductor chip 30 exposed on the first surface 102 of the die paddle 110, e.g., a bonding pad (not shown). Therefore, all of the bonding wires 42, 44, and 46 in the semiconductor package 1 may be formed on the same surface.

Furthermore, a molding layer 80 surrounding the semiconductor chip 10, the assistant semiconductor chip 30, the die paddle 110, the bonding wires 42, 44, and 46, and a portion of the lead 120 may be formed. The molding layer 80 may be formed of an epoxy molding compound (EMC), for example.

As shown in the lead frames 100a, 100b, 100c, 100d, and 100e of FIGS. 1 through 5, the area of the top portion of the opening 150 may be smaller than the area of the top surface of the die paddle 110 to which the semiconductor chip 10 is to be attached, and more particularly, the area of the semiconductor chip attaching area 110-C1. Therefore, although only sectional view are shown in FIGS. 6 through 9, the area of the top surface of the assistant semiconductor chip 30 may be smaller than the area of the top surface of the semiconductor chip 10. Here, the top surface of the semiconductor chip 10 refers to an active surface of the semiconductor chip 10.

The semiconductor chip 10 may be a memory chip including flash memory devices, for example. The assistant semiconductor chip 30 may be a semiconductor chip for controlling the semiconductor chip 10 or a semiconductor chip for performing a separate control function together with the semiconductor chip 10.

If the semiconductor chip 10 is a flash memory chip such as a NAND flash memory chip, the assistant semiconductor chip 30 may be a controller such as a semiconductor chip for performing wearing-leveling, error correcting code (ECC), defective block control, bad block mapping, read scrubbing & read disturb management, read and write caching, and garbage collection for the semiconductor chip 10. In other words, the assistant semiconductor chip 30 may be a semiconductor chip for performing functions for guaranteeing data, maximizing lifespan, and improving performance of the semiconductor chip 10. The assistant semiconductor chip 30 may be other known controllers.

Figure 7:
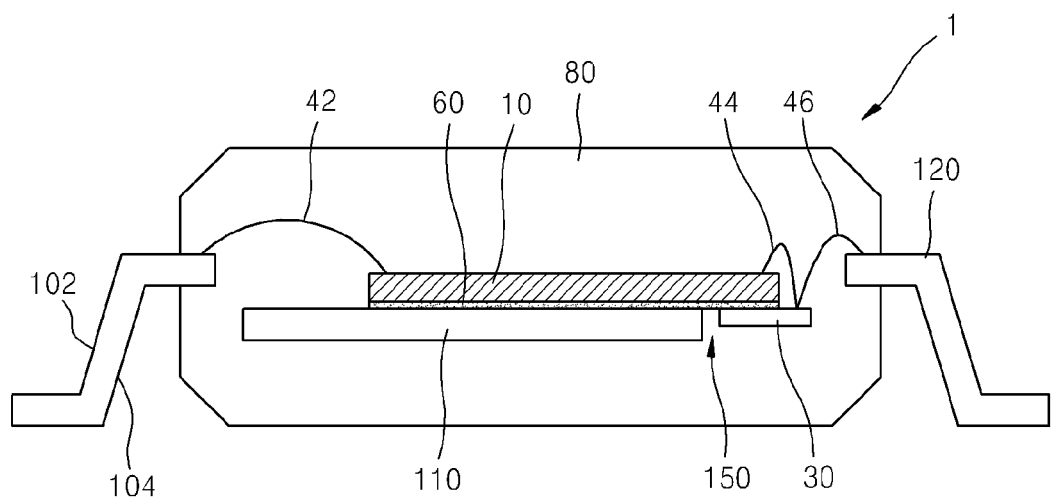

FIG. 7 is a sectional view of another semiconductor package 1 according to some embodiments.

Referring to FIGS. 1, 3, 6, and 7, the openings 150 shown in FIGS. 1 and 6 may be a through-hole, whereas the openings 150 shown in FIGS. 3 and 7 may be a notch formed in a perimeter of the die paddle 110. In other words, the assistant semiconductor chip 30 shown in FIG. 6 is housed in the space located in the opening 150 and is completely surrounded by the die paddle 110. However, in FIG. 7, although the assistant semiconductor chip 30 is also housed in the space located in the opening 150, the semiconductor chip 30 is only partially surrounded by the die paddle 110.

Other than the difference described above, the shape of the semiconductor package 1 shown in FIG. 6 and the shape of the semiconductor package 1 shown in FIG. 7 may be substantially identical to each other. Therefore, in the following descriptions of semiconductor packages, there may be no distinction made between employing the lead frame 100a shown in FIG. 1 and employing the lead frame 100c shown in FIG. 3 unless there is a remarkable difference. In other words, unless stated otherwise, the lead frame 100c shown in FIG. 3 may be alternatively applied to semiconductor packages employing the lead frame 100a shown in FIG. 1, or vice versa.

Figure 8:
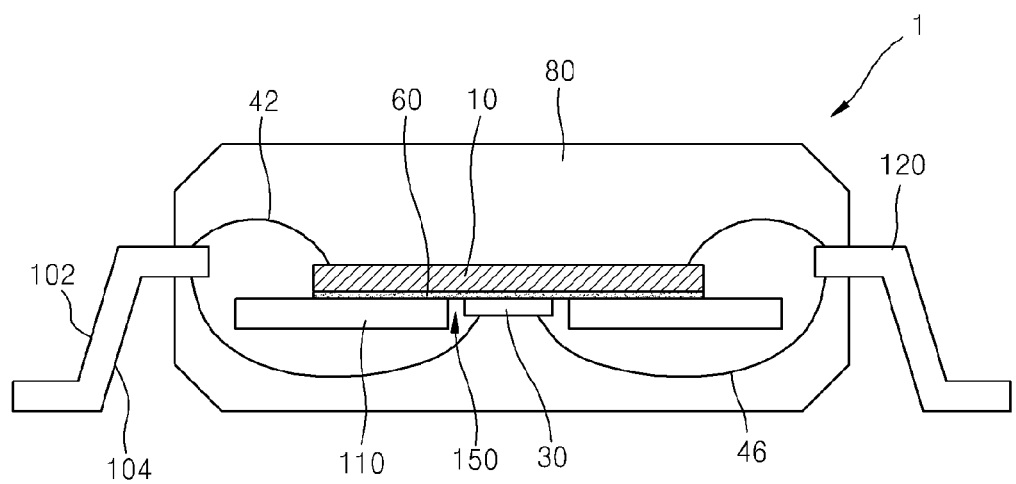

FIG. 8 is a sectional view of another semiconductor package 1 according to the some embodiments.

Referring to FIGS. 1, 4, 6, and 8, the openings 150 shown in FIGS. 1 and 6 may be adjacent to edges of the die paddles 110, whereas the openings 150 shown in FIGS. 4 and 8 may be arranged near the centers of the die paddles 110.

Furthermore, although the semiconductor chip 10 shown in FIG. 6 is attached on the die paddle 110 to partially cover the opening 150, the semiconductor chip 10 shown in FIG. 8 is attached on the die paddle 110 to completely cover the opening 150. Therefore, the assistant semiconductor chip 30 shown in FIG. 8 may be completely covered by the semiconductor chip 10 on the first surface 102 of the die paddle 110. In this case, the active surface of the assistant semiconductor chip 30 may be opposite to the surface facing the semiconductor chip 10.

The third bonding wire 46, which electrically interconnects the assistant semiconductor chip 30 and the lead 120, may be formed on the second surface 104 of the lead frame. The first bonding wire 42, which electrically interconnects the semiconductor chip 10 and the lead 120, may be formed on the first surface 102 of the lead frame. Accordingly, defects due to undesirable contacts between the bonding wires 42 and 46 may be reduced by forming the first bonding wire 42 and the third bonding wire 46 on different surfaces.

Figure 9:
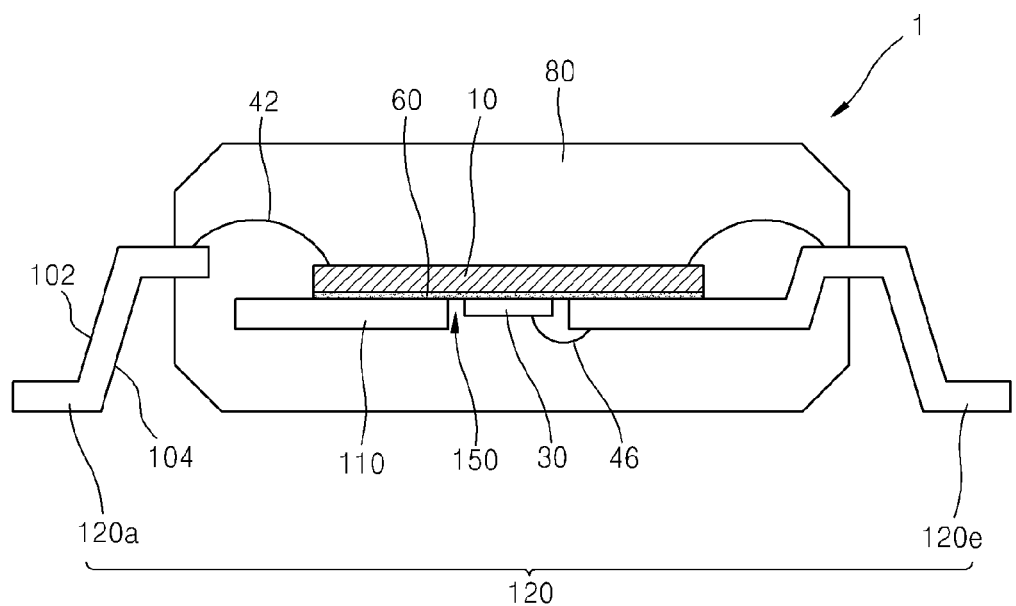

FIG. 9 is a sectional view of another semiconductor package 1 according to some embodiments.

Referring to FIGS. 4, 5, 8, and 9, the leads 120 shown in FIGS. 5 and 9 include both the long lead 120e and the short lead 120a. Therefore, the bonding wire 46 electrically interconnecting the assistant semiconductor chip 30 and the lead 120 shown in FIG. 9 may be shorter than the third bonding wire 46 shown in FIG. 8.

Therefore, except the length of the third bonding wire 46, the shape of the semiconductor package 1 shown in FIG. 8 and the shape of the semiconductor package 1 shown in FIG. 9 are substantially identical to each other. Therefore, in descriptions of semiconductor packages shown below, the case of employing the lead frame 100d shown in FIG. 4 and the case of employing the lead frame 100e shown in FIG. 5 may not be distinguished unless there is a remarkable difference. In other words, unless stated otherwise, the lead frame 100e shown in FIG. 5 may be alternatively applied to semiconductor packages employing the lead frame 100d shown in FIG. 4, or vice versa.

Therefore, according to some embodiments of the present application, a semiconductor package may include a lead frame including a die paddle having a first surface and a defined boundary. The semiconductor package may further include a first semiconductor chip having a front surface and a back surface. The back surface of the first semiconductor chip may be disposed on the first surface of the die paddle so as to extend past the defined boundary of the die paddle. In addition, a second semiconductor chip may be disposed on the back surface of the first semiconductor chip in a portion of the first semiconductor chip that extends past the defined boundary of the die paddle.

As shown above, for example, in FIG. 1, the defined boundary of the die paddle 110 surrounds a through-hole opening 150 that extends through the die paddle 110. The first semiconductor chip may at least partially overlap the through-hole opening 150 as shown in FIG. 6.

In some embodiments, as shown in FIG. 3 for instance, the defined boundary of the die paddle 110 provides a notch opening 150 arranged in a perimeter of the die paddle 110.

In some embodiments, as shown in FIG. 5, a part of the plurality of leads 120 extends into the notch opening 150.

FIGS. 10 through 14 are sectional views showing a semiconductor package according to another embodiment of the inventive concept and a method of fabricating the same.

Figure 10:
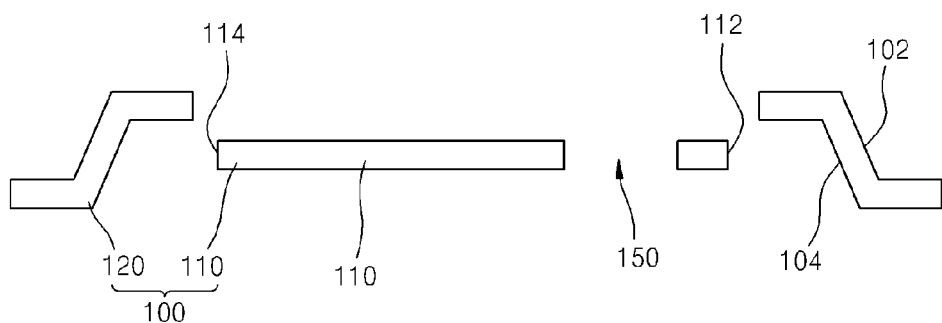
FIGS. 10 through 14 are sectional views showing a semiconductor package according to a second embodiment of the inventive concept and a method of fabricating the same.

FIG. 10 is a sectional view showing processes of preparing a lead frame for fabricating a semiconductor package according to some embodiments.

Referring to FIG. 10, a lead frame 100 includes the die paddle 110 and the plurality of leads 120, which are arranged around the die paddle 110. The opening 150 is formed in the die paddle 110.

The opening 150 may be a through-hole formed in the die paddle 110. The opening 150 may be arranged near the first edge 112 of the die paddle 110. The lead frame 100 may be the lead frames 100a and 100b shown in FIGS. 1 and 2, respectively. Alternatively, the lead frame 100 may be replaced with the lead frame 100c shown in FIG. 3.

The shape of the lead frame 100, and more particularly, the bending shape of the leads 120 may be formed either at this step or at a later step. Furthermore, the die paddle 110 and the plurality of leads 120 may be connected to each other and cut and separated from each other at a later step. The shape of the lead 120 shown in FIG. 10 is merely an example, and the inventive concept is not limited thereto.

Figure 11:
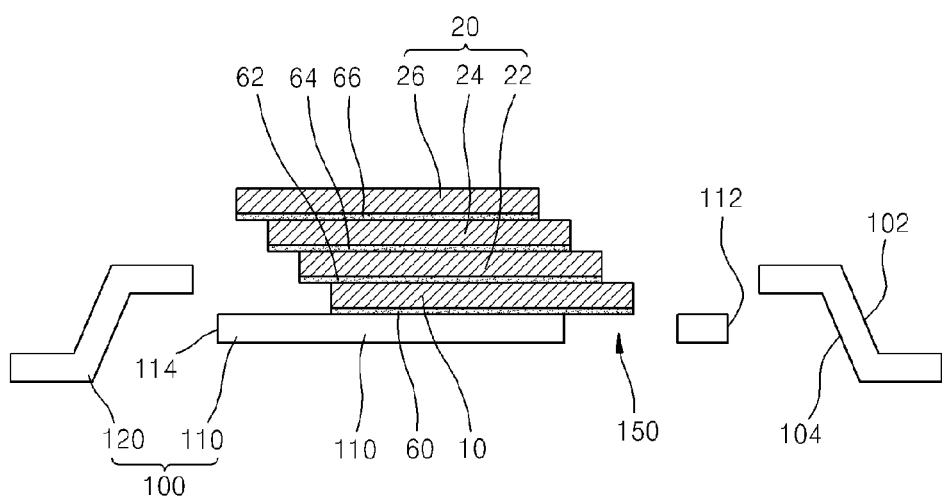

FIG. 11 is a sectional view showing processes of stacking a first semiconductor chip and a second semiconductor chip for fabricating a semiconductor package according to some embodiments.

Referring to FIG. 11, a first semiconductor chip 10 may be attached on the first surface 102 of the die paddle 110. The first semiconductor chip 10 may be attached on the die paddle 110 to partially cover the opening 150. Next, at least one second semiconductor chip 20 may be stacked on the first semiconductor chip 10. Here, either one second semiconductor chip 20 or a plurality of second semiconductor chips 20 may be stacked on the first semiconductor chip 10.

The second semiconductor chip 20 may be stacked on and offset from the first semiconductor chip 10, such that at least a portion of the top surface of the first semiconductor chip 10 is exposed. Thus, the second semiconductor chip 20 may extend past an edge of the first semiconductor chip 10. If a plurality of the second semiconductor chips 20 are stacked, each of the second semiconductor chips 20 may be stacked to be offset from a semiconductor chip therebelow, such that at least a portion of the semiconductor chip therebelow is exposed. Each of a plurality of second semiconductor chips 20 may be offset from the previous chip by a predetermined distance, such that successive second semiconductor chips 20 are offset from the first semiconductor chip 10 by increasingly larger distances.

The first semiconductor chip 10 and the plurality of second semiconductor chips 20 may be stacked in a cascaded shape. For example, each of the second semiconductor chips 20 may be stacked on the previous chip, such that successive second semiconductor chips 20 are offset by longer distances from the second edge 114.

In other words, where the plurality of second semiconductor chips 20 are sequentially stacked, each of a plurality of second semiconductor chips 22, 24, and 26 may be offset by a predetermined distance with respect to a semiconductor chip immediately therebelow. For example, in the case where three second semiconductor chips 20 are stacked, the uppermost second semiconductor chip 26 may be offset by a predetermined distance with respect to the middle second semiconductor chip 24, so that at least a portion of the top surface of the middle second semiconductor chip 24 is exposed, whereas the middle second semiconductor chip 24 may be offset by a predetermined distance with respect to the bottommost second semiconductor chip 22, so that at least a portion of the top surface of the bottommost second semiconductor chip 22 is exposed.

The second semiconductor chip 20 can extend past the edge of the first semiconductor chip 10 on a first side of the die paddle 110. The portion of the opening 150 not covered by the first semiconductor chip 10 may be arranged on a second side of the die paddle 110 located opposite to the first side of the die paddle 110. The first semiconductor chip 10 and the second semiconductor chips 22, 24, and 26 may be attached through adhesive layers 60, 62, and 64. The adhesive layers 60, 62, and 64 may be formed of an adhesive, such as epoxy, or an adhesive layer 60, such as a die attach film or a die attach paste.

When the first semiconductor chip 10 is attached on the die paddle 110 through the adhesive layer 60, such as a die attach film, to partially cover the opening 150, a portion of the adhesive layer 60 used to attach the first semiconductor chip 10 may be exposed in the opening 150.

Figure 12:
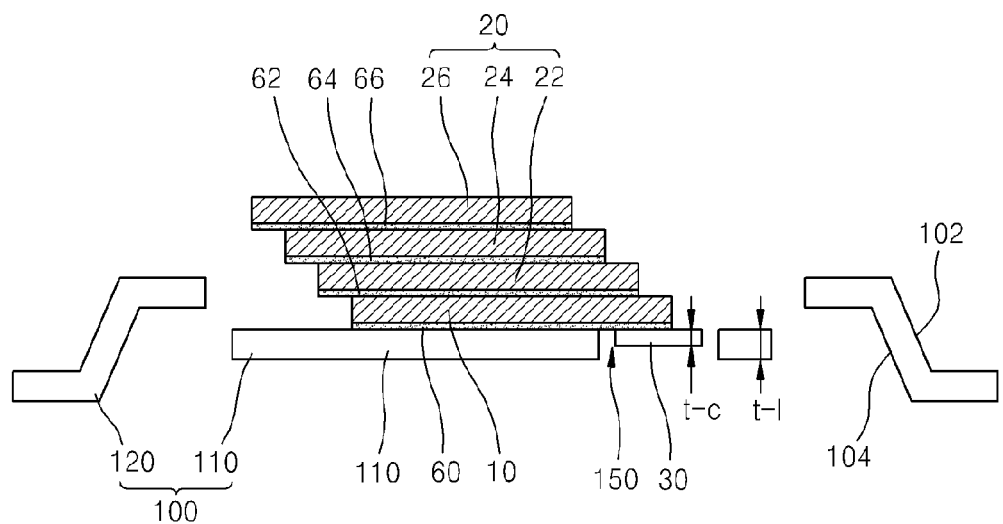

FIG. 12 is a sectional view showing a step of attaching an assistant semiconductor chip for fabricating a semiconductor package according to some embodiments.

Referring to FIG. 12, the assistant semiconductor chip 30 may be attached on the first semiconductor chip 10 through the opening 150. In other words, the assistant semiconductor chip 30 may be attached on a surface of the first semiconductor chip 10 facing the die paddle 110.

In this case, the assistant semiconductor chip 30 may be attached on the first semiconductor chip 10 through the adhesive layer 60, which is attached on the back surface of the first semiconductor chip 10 exposed in the opening 150. Therefore, the assistant semiconductor chip 30 may be attached on the first semiconductor chip 10 without a separate adhesive material.

The assistant semiconductor chip 30 may be arranged to extend between a portion of the opening 150 not covered by the first semiconductor chip 10 and a portion of the opening 150 covered by the first semiconductor chip 10. In other words, the assistant semiconductor chip 30 may be arranged such that the assistant semiconductor chip 30 is partially exposed through the opening 150.

The assistant semiconductor chip 30 may be attached at any step in the process between the step at which the first semiconductor chip 10 is attached on the die paddle 110 and the step at which bonding wires are formed as described below. However, if the first semiconductor chip 10 and the second semiconductor chip 20 are semiconductor chips of a same type and are successively stacked, the assistant semiconductor chip 30 may be attached after the first semiconductor chip 10 and the second semiconductor chip 20 are stacked.

Figure 13:
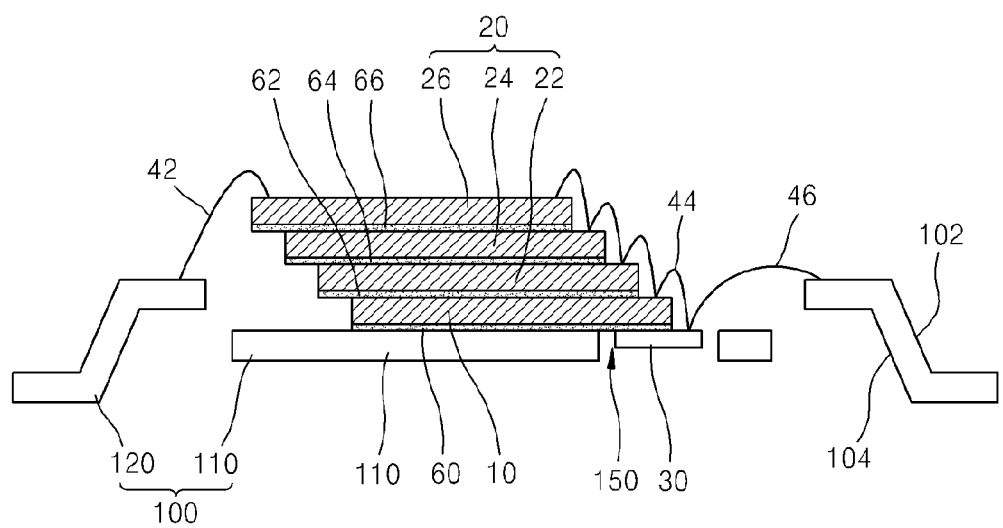

FIG. 13 is a sectional view showing a process of forming bonding wires for fabricating a semiconductor package according to some embodiments.

Referring to FIG. 13, the first semiconductor chip 10, the at least one second semiconductor chip 20, the assistant semiconductor chip 30, and the lead 120 are electrically connected to each other through the bonding wires 42, 44 and 46.

Since the portion of the opening 150 not covered by the first semiconductor chip 10 is on a side of the die paddle 110 opposite to another side of the die paddle 110 in which the second semiconductor chip 20 extends past the edge of the first semiconductor chip, a portion of the assistant semiconductor chip 30 may extend beyond both the first semiconductor chip 10 and the second semiconductor chip 20. Therefore, the bonding wires 44 and 46 electrically interconnecting the first semiconductor chip 10, the at least one second semiconductor chip 20, the assistant semiconductor chip 30, and the lead 120 may be formed on the same surface of the lead frame 100, that is, the first surface 102.

Figure 14:
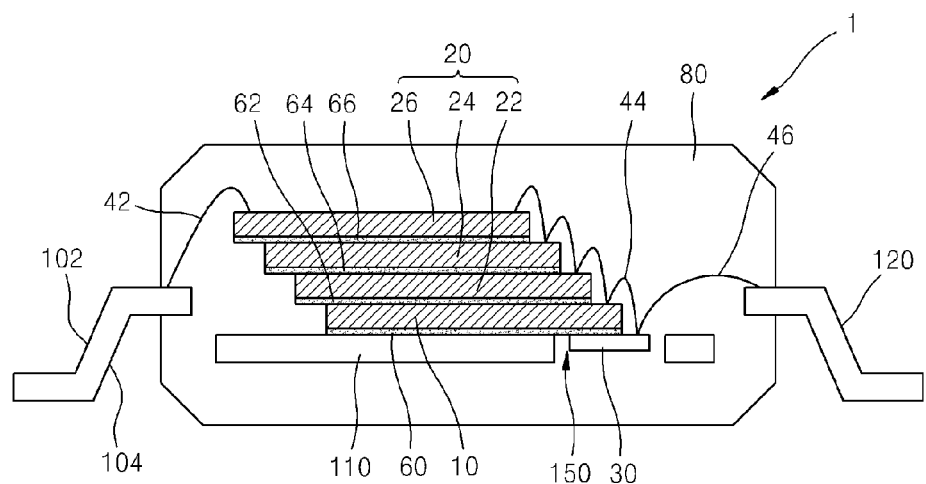

FIG. 14 is a sectional view of a semiconductor package 1 according to some embodiments.

Referring to FIG. 14, the semiconductor package 1 is formed by forming a molding layer 80 encapsulating the first semiconductor chip 10, the at least one second semiconductor chip 20, the assistant semiconductor chip 30, the die paddle 110, the bonding wires 42, 44 and 46, and a portion of the lead 120. The molding layer 80 may be formed of an epoxy molding compound (EMC), for example.

The first semiconductor chip 10 and the at least one second semiconductor chip 20 may be memory chips such as dynamic random access memory (DRAM) or flash memory devices, for example. The assistant semiconductor chip 30 may be a semiconductor chip for controlling the first semiconductor chip 10 and the at least one second semiconductor chip 20 or a semiconductor chip for performing a separate control function together with the first semiconductor chip 10 and the second semiconductor chip 20.

Where the first semiconductor chip 10 and the second semiconductor chip 20 are NAND flash memory chips, the assistant semiconductor chip 30 may be a semiconductor chip for performing wearing-leveling, error correcting code (ECC), or defective block control for the first semiconductor chip 10 and the second semiconductor chip 20. In other words, the assistant semiconductor chip 30 may be a semiconductor chip for performing functions for, e.g., guaranteeing data, maximizing lifespan, and improving performance of the first semiconductor chip 10 and the second semiconductor chip 20.

The first semiconductor chip 10 and the at least one second semiconductor chip 20 may be multi level cell (MLC) NAND flash memory chips. Each of flash memory cells included in an MLC NAND flash memory chip has various levels of potentials, so that data exceeding 1 bit may be stored in one flash memory cell. Therefore, depending on applications, it may be desirable to precisely control potentials to distinguish and maintain various levels of potentials.

Therefore, where the first semiconductor chip 10 and the second semiconductor chip 20 are MLC NAND flash memory chips, the assistant semiconductor chip 30 may perform, for example, multi-leveling ECC function for distinguishing and maintaining levels of potentials stored in each of flash memory cells included in the first semiconductor chip 10 and the at least one second semiconductor chip 20.

Especially, where the first semiconductor chip 10 and the at least one second semiconductor chip 20 are MLC NAND flash memory chips, which store 2 bits, 3 bits, or more bits of data in one flash memory cell, a region for forming circuits other than NAND cells may increase. Therefore, the volumes of the first semiconductor chip 10 and the at least one second semiconductor chip 20 may be reduced by forming a portion of circuits other than NAND cells on the assistant semiconductor chip 30, and thus the overall process of fabricating the first semiconductor chip 10 and the at least one second semiconductor chip 20 may be simplified.

Alternatively, in the case where the first semiconductor chip 10 and the at least one second semiconductor chip 20 are semiconductor chips of a same type, e.g., NAND flash memory chips of a same type, the volumes of the first semiconductor chip 10 and the second semiconductor chip 20 may be reduced by forming a portion of circuits other than NAND cells on the assistant semiconductor chip 30, and thus the overall process of fabricating the first semiconductor chip 10 and the second semiconductor chip 20 may be simplified.

Therefore, according to some embodiments, to form a semiconductor package, a package substrate such as a lead frame or a PCB substrate having a first surface and a boundary defined by edges of the package substrate is provided. Then, a first semiconductor chip having a front surface and a back surface is provided. The back surface of a first portion of the first semiconductor chip is disposed on the first surface of the package substrate with the back surface of a second portion of the first semiconductor chip extending beyond of the defined boundary of the package substrate. Subsequently, a second semiconductor chip is disposed on the back surface of the second portion of the first semiconductor chip that extends beyond the defined boundary of the package substrate.

Figure 15:
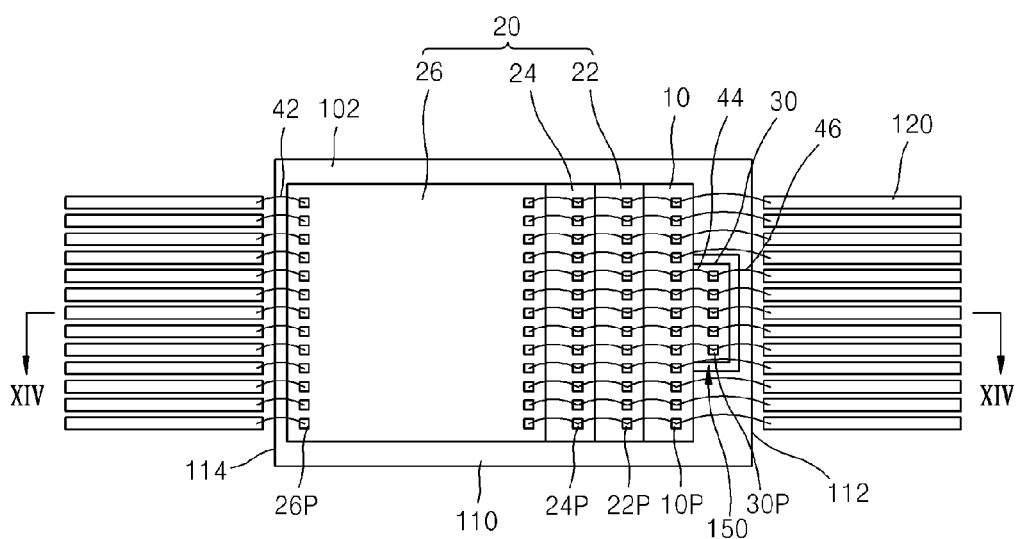
FIG. 15 is a plan view of a semiconductor package according to the second embodiment of the inventive concept.

FIG. 15 is a plan view of a semiconductor package according to some embodiments. Here, FIG. 14 is a sectional view taken along a line XIV-XIV of FIG. 15.

Referring to FIG. 15, the first semiconductor chip 10 and the at least one second semiconductor chip 20 are stacked on the first surface 102 of the die paddle 110. Furthermore, the assistant semiconductor chip 30 is inserted into the opening 150 of the die paddle 110, and a portion of the assistant semiconductor chip 30 is exposed. Each of the plurality of second semiconductor chips 22, 24, and 26 may be stacked offset from a semiconductor chip therebelow, so that a portion of the semiconductor chip therebelow is exposed. Bonding pads 10P, 22P, 24P, 26P, and 30P are respectively formed on the first semiconductor chip 10, the plurality of second semiconductor chips 22, 24, and 26, and the assistant semiconductor chip 30.

The bonding pads 30P on the assistant semiconductor chip 30 may be arranged in a line, adjacent to a side of a portion of the assistant semiconductor chip 30 not covered by the first semiconductor chip 10. Although not shown, if the assistant semiconductor chip 30 is inserted into the opening 150 of the lead frame 100b shown in FIG. 2, the bonding pads 30P on the assistant semiconductor chip 30 may be arranged in lines on two perpendicular sides, forming an L-shape, of a portion of the assistant semiconductor chip 30 not covered by the first semiconductor chip 10. In other words, the opening 150 shown in FIG. 2 is a through-hole and is disposed in a corner of the die paddle 110, so that the exposed sides of the assistant semiconductor chip 30 form an L-shape.

The bonding wires 42, 44, and 46 may electrically interconnect the first semiconductor chip 10, the plurality of second semiconductors chip 22, 24, and 26, the assistant semiconductor chip 30, and the leads 120. Each of the bonding wires 42, 44, and 46 may be selectively electrically connected to the first semiconductor chip 10, the plurality of second semiconductor chips 22, 24, and 26, and the assistant semiconductor chip 30 through the bonding pads 10P, 22P, 24P, 26P, and 30P. In other words, connections between the bonding wires 42, 44, and 46 and the first semiconductor chip 10 mean connections of the bonding wires 42, 44, and 46 and the bonding pad 10P of the first semiconductor chip 10 and connections between the bonding wires 42, 44, and 46 and individual electronic devices within the first semiconductor chip 10. The bonding wires 42, 44, and 46 may be connected to the plurality of second semiconductor chip 20 and the assistant semiconductor chip 30 in the same manner.

A part of the bonding wires 42, 44, and 46 may be connected to the leads 120 through the plurality of second semiconductor chips 22, 24, and 26 and the first semiconductor chip 10 in the order stated. The bonding wire 42 may directly connect the topmost second semiconductor chip 26 and the lead 120.

Furthermore, another part of the bonding wires 42, 44, and 46 may be connected to the leads 120 through the plurality of second semiconductor chips 20, the first semiconductor chip 10, and the assistant semiconductor chip 30 in the order stated. Therefore, the bonding pads 30P on the assistant semiconductor chip 30 may be formed on the portion of the assistant semiconductor chip 30 not covered by the first semiconductor chip 10.

Rewiring conductive lines (not shown), which are electrically connected to the bonding pads 10P, 22P, 24P, 26P, and 30P, respectively, may be formed on the first semiconductor chip 10, the plurality of second semiconductor chips 22, 24, and 26, and the assistant semiconductor chip 30.

Figure 16:
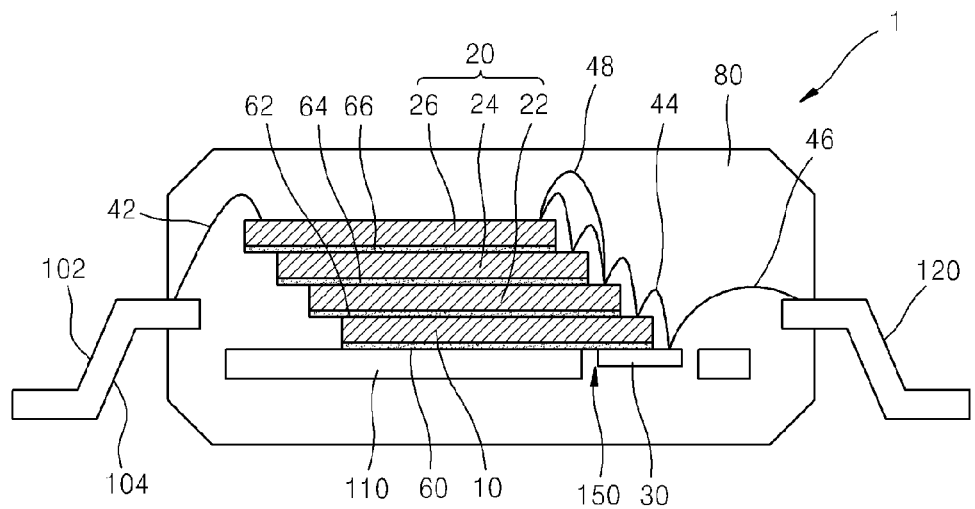
FIG. 16 is a sectional view of a semiconductor package according to a modification of the first embodiment of the inventive concept.

FIG. 16 is a sectional view of a semiconductor package 1 according to a modification of an embodiment of the inventive concept.

Referring to FIG. 16, the semiconductor package 1 may further include a jumping bonding wire 48. The semiconductor package shown in FIG. 14 include the bonding wire 44, which sequentially connects the topmost second semiconductor chip 26, the middle second semiconductor chip 24, the bottommost second semiconductor chip 22, and the first semiconductor chip 10. However, the semiconductor package 1 shown in FIG. 6 further includes the jumping bonding wire 48, which jumps over the middle second semiconductor chip 24 and directly connects the topmost second semiconductor chip 26 and the bottommost second semiconductor chip 22.

In other words, unlike the bonding wire 44 connecting a pair of adjacent semiconductor chips, e.g., the topmost second semiconductor chip 26 and the middle second semiconductor chip 24, the jumping bonding wire 48 connects a pair of non-adjacent semiconductor chips, e.g., the topmost second semiconductor chip 26 and the bottommost second semiconductor chip 22.

Furthermore, although not shown, the jumping bonding wire 48 may connect the topmost second semiconductor chip 26 and the first semiconductor chip 10 or may connect the middle second semiconductor chip 24 and the first semiconductor chip 10. Since a electrical path from the leads 120 may be shortened by the jumping bonding wire 48, the speed of a semiconductor package, in which a plurality of semiconductor chips are stacked, may be improved.

FIGS. 17 through 20 are sectional views showing a semiconductor package according to another embodiment of the inventive concept and a method of fabricating the same.

Figure 17:
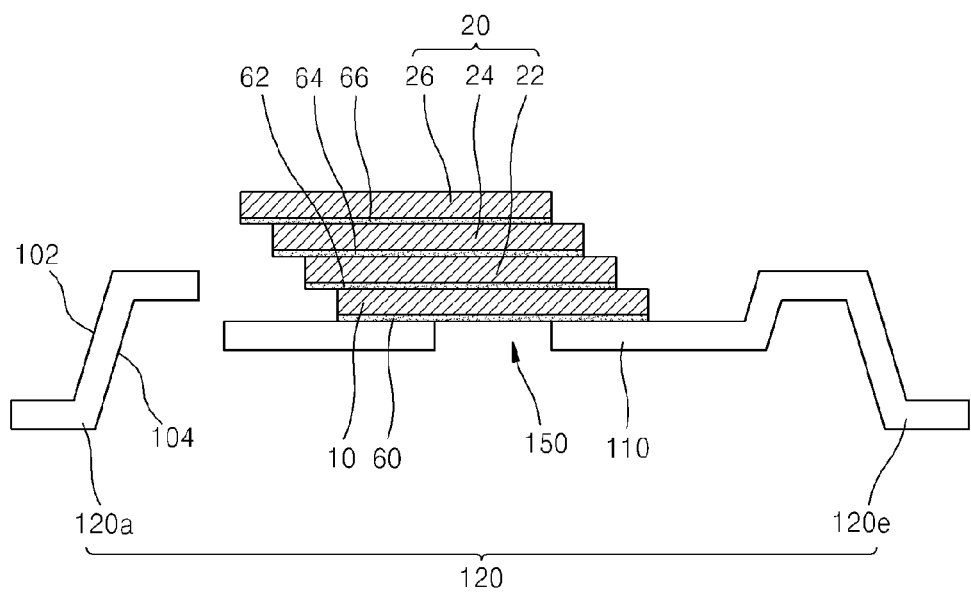
FIGS. 17 through 20 are sectional views showing a semiconductor package according to a third embodiment of the inventive concept and a method of fabricating the same.

FIG. 17 is a sectional view showing a step of stacking a first semiconductor chip and at least one second semiconductor chip for fabricating a semiconductor package according to some embodiments.

Referring to FIG. 17, the first semiconductor chip 10 and the at least one second semiconductor chip 20 are sequentially stacked on the first surface 102 of the die paddle 110. The at least one second semiconductor chip 20 may be stacked offset from the first semiconductor chip 10, such that at least a portion of the top surface of the semiconductor chip 10 is exposed. if a plurality of the second semiconductor chips 20 are stacked, each of the second semiconductor chips 20 may be stacked offset from a semiconductor chip therebelow, such that at least a portion of the semiconductor chip therebelow is exposed. The first semiconductor chip 10 and the plurality of second semiconductor chips 22, 24, and 26 may be stacked through adhesive layers 60, 62, 64, and 66, respectively.

The opening 150 can be arranged at the center of the die paddle 110, and the first semiconductor chip 10 can be attached on the die paddle 110 to completely cover the opening 150.

The lead frame shown in FIG. 17 may be the lead frame 100e shown in FIG. 5. Alternatively, the lead frame 100d shown in FIG. 4 may replace the lead frame shown in FIG. 17.

Figure 18:
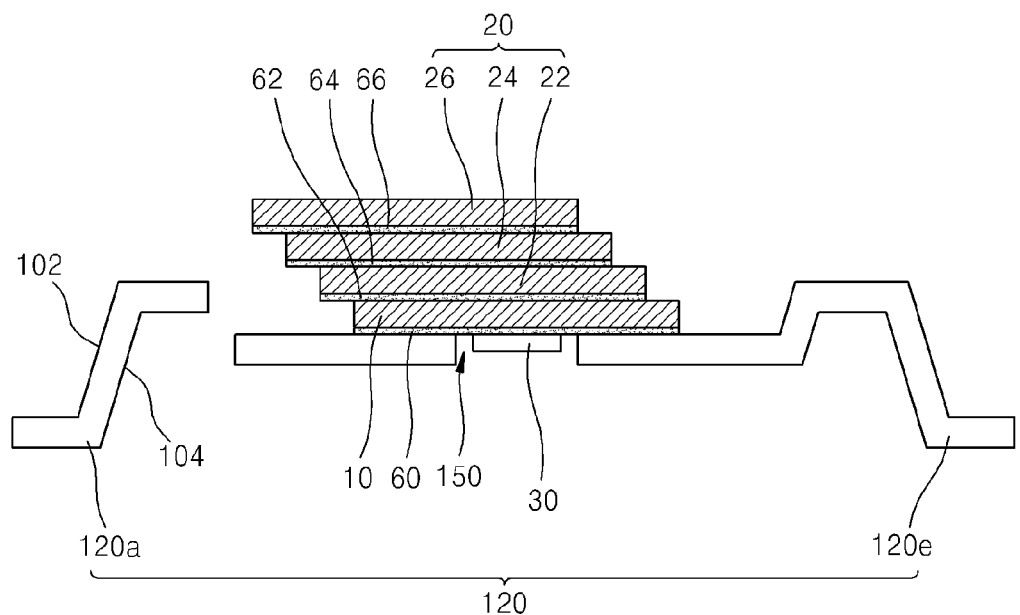

FIG. 18 is a sectional view showing processes of attaching an assistant semiconductor chip for fabricating a semiconductor package according to some embodiments.

Referring to FIG. 18, the assistant semiconductor chip 30 may be attached on the first semiconductor chip 10 through the opening 150. In other words, the assistant semiconductor chip 30 may be attached on an exposed surface of the first semiconductor chip 10 in a direction facing the die paddle 110. The assistant semiconductor chip 30 may be attached on the first semiconductor chip 10 through the adhesive layer 60, which is attached on the back surface of the first semiconductor chip 10 exposed through the opening 150. Therefore, the assistant semiconductor chip 30 may be attached on the first semiconductor chip 10 without a separate adhesive material.

The assistant semiconductor chip 30 may be completely covered by the first semiconductor chip 10 on the first surface 102 of the die paddle 110. Therefore, the active surface of the assistant semiconductor chip 30 may be opposite to the surface facing the first semiconductor chip 10.

Figure 19:
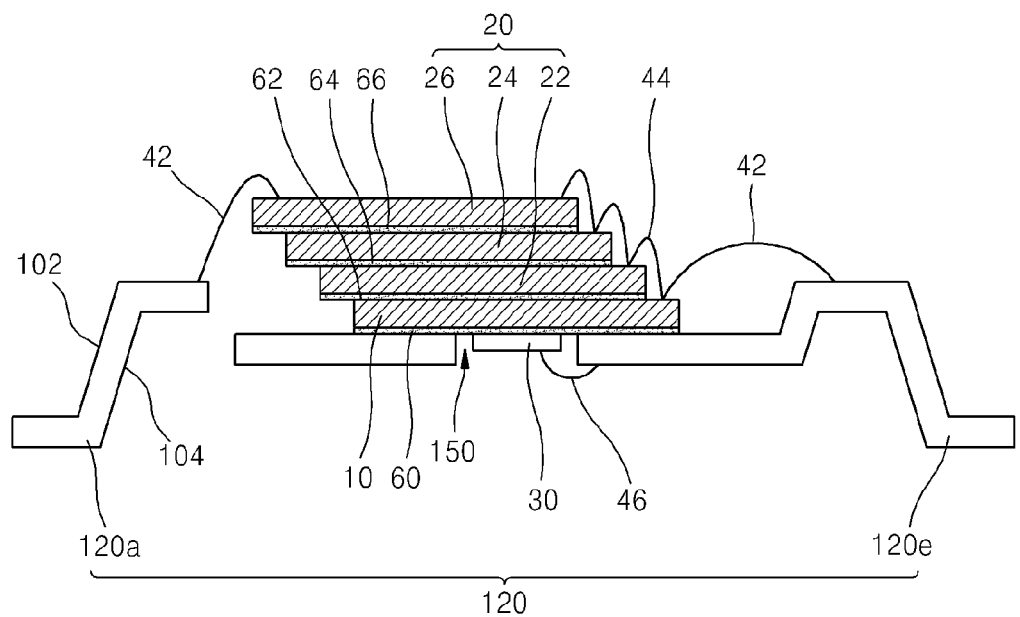

FIG. 19 is a sectional view showing processes of forming bonding wires for fabricating a semiconductor package according to some embodiments.

Referring to FIG. 19, the first semiconductor chip 10, the second semiconductor chip 20, the assistant semiconductor chip 30, and the lead 120 are electrically connected to each other through the bonding wires 42, 44 and 46. A bonding wire connected to the first semiconductor chip 10 and the second semiconductor chip 20, that is, the first bonding wire 42 and a bonding wire connected to the assistant semiconductor chip 30, that is, the third bonding wire 46 may be formed on different surfaces of the lead frame 100. In other words, the first bonding wire 42 and the third bonding wire 46 may be respectively formed on the first surface 102 and the second surface 104.

Therefore, after the first bonding wire 42 is formed, the first semiconductor chip 10 and the second semiconductor chip 20 may be turned upside down and the third bonding wire 46 may be formed thereon. The sequence of forming the first bonding wire 42 and the third bonding wire 46 may be reversed.

Figure 20:
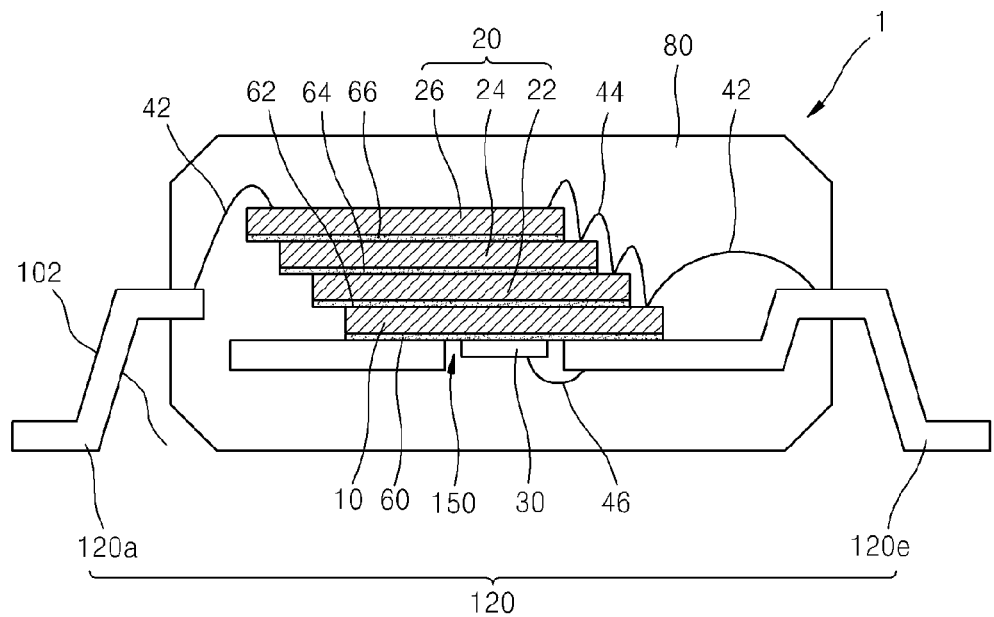

FIG. 20 is a sectional view of a semiconductor package 1 according to some embodiments.

Referring to FIG. 20, the semiconductor package 1 may be formed by forming a molding layer 80 encapsulating the first semiconductor chip 10, the second semiconductor chip 20, the assistant semiconductor chip 30, the die paddle 110, the bonding wires 42 and 46, and a portion of the lead 120. The molding layer 80 may be formed of an epoxy molding compound (EMC), for example.

The assistant semiconductor chip 30 may be completely covered by a portion of the first semiconductor chip 10. Furthermore, a third bonding wire 46, connected to the assistant semiconductor chip 30, may be formed on a surface different from the surface on which the first bonding wire 42 is formed.

FIGS. 21 through 26 are sectional views of a semiconductor package according to another embodiment of the inventive concept and a method of fabricating the same.

Figure 21:
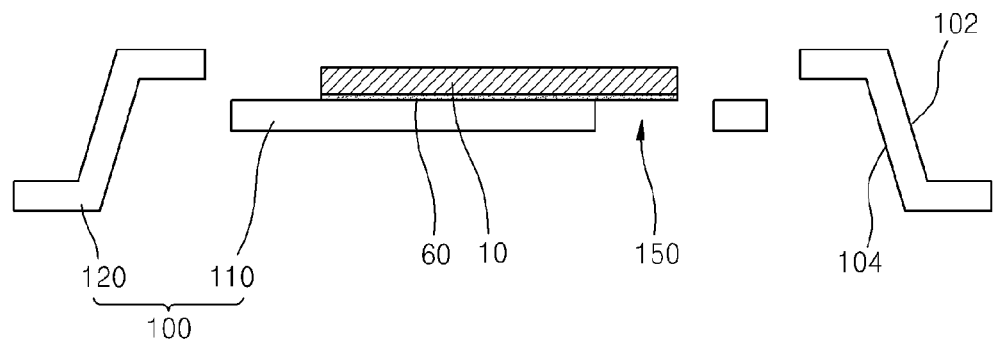
FIGS. 21 through 26 are sectional views of a semiconductor package according to a fourth embodiment of the inventive concept and a method of fabricating the same.

FIG. 21 is a sectional view showing processes of attaching a first semiconductor chip for fabricating a semiconductor package according to some embodiments.

Referring to FIG. 21, the first semiconductor chip 10 is attached on the first surface 102 of the die paddle 110, in which the opening 150 is formed. The first semiconductor chip 10 may be attached on the die paddle 110 through the adhesive layer 60.

The opening 150 can be arranged to extend between the semiconductor chip attaching region and the peripheral region (not shown), and the first semiconductor chip 10 can be attached on the die paddle 110 to partially cover the opening 150.

The lead frame shown in FIG. 21 may be lead frame 100a or 100b shown in FIGS. 1 and 2. Alternatively, the lead frame 100c shown in FIG. 3 may replace the lead frame shown in FIG. 21.

Figure 22:
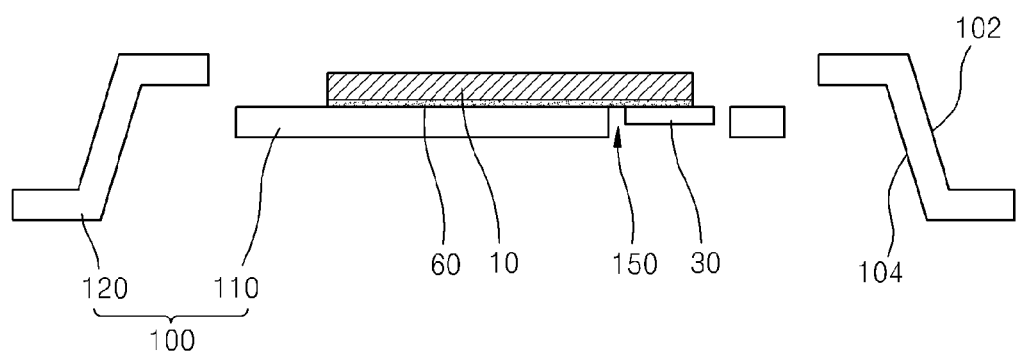

FIG. 22 is a sectional view showing processes of attaching an assistant semiconductor chip for fabricating a semiconductor package according to some embodiments.

Referring to FIG. 22, the assistant semiconductor chip 30 may be attached on the first semiconductor chip 10 through the opening 150. In other words, the assistant semiconductor chip 30 may be attached on an exposed surface of the first semiconductor chip 10 facing the die paddle 110.

In this case, the assistant semiconductor chip 30 may be attached on the first semiconductor chip 10 through the adhesive layer 60, which is attached on the back surface of the first semiconductor chip 10 exposed in the opening 150. Therefore, the assistant semiconductor chip 30 may be attached on the first semiconductor chip 10 without a separate adhesive material. The assistant semiconductor chip 30 may be attached on the first semiconductor chip 10 before a second semiconductor chip described below is attached.

The assistant semiconductor chip 30 may be arranged to extend between a portion of the opening 150 exposed by the first semiconductor chip 10 and a portion of the opening 150 covered by the first semiconductor chip 10. In other words, the assistant semiconductor chip 30 may be arranged such that the assistant semiconductor chip 30 is partially exposed through the opening 150.

Figure 23:
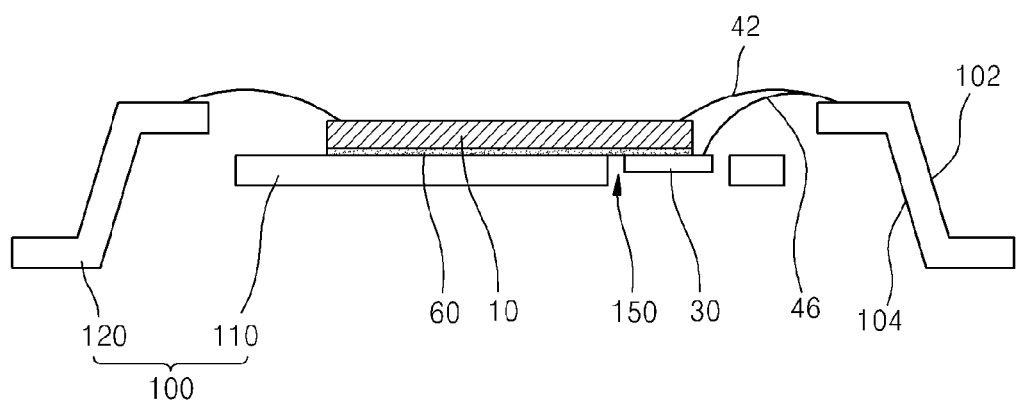

FIG. 23 is a sectional view showing processes of forming bonding wires for electrically connecting a first semiconductor chip, an assistant semiconductor chip, and leads for fabricating a semiconductor package according to some embodiments.

Referring to FIG. 23, the bonding wires 42 and 46 for electrically connecting the first semiconductor chip 10, the second semiconductor chip 20, the assistant semiconductor chip 30, and the lead 120 are formed. The bonding wires 42 and 46 may be formed between the first semiconductor chip 10 and the lead 120 and between the assistant semiconductor chip 30 and the lead 120. Although not shown, a bonding wire may be selectively formed between the first semiconductor chip 10 and the assistant semiconductor chip 30.

Figure 24:
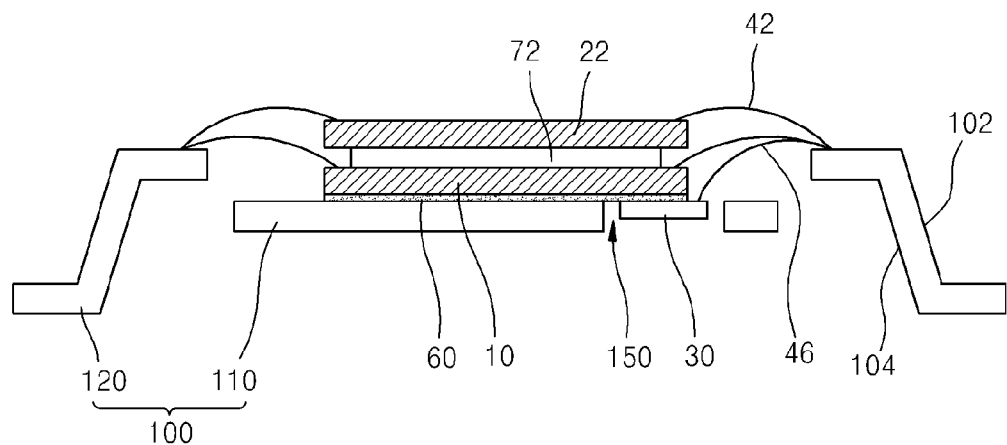

FIG. 24 is a sectional view showing processes of forming a second semiconductor chip and a bonding wire for electrically connecting the second semiconductor chip and leads for fabricating a semiconductor package according to some embodiments.

Referring to FIG. 24, the second semiconductor chip 22 may be stacked on the first semiconductor chip 10. The first semiconductor chip 10 and the second semiconductor chip 22 may be stacked vertically on substantially the same center axis.

To attach the second semiconductor chip 22 on the first semiconductor chip 10, a spacer 72 may be formed to be interposed between the first semiconductor chip 10 and the second semiconductor chip 22. The spacer 72 may be formed to have a predetermined thickness, so that the bonding wire 42 connected to the first semiconductor chip 10 does not directly contact the second semiconductor chip 22. An adhesive material may be applied to two opposite surfaces of the spacer 72.

Furthermore, the spacer 72 may be selectively attached on the first semiconductor chip 10 in advance before the bonding wire 42 connected to the first semiconductor chip 10 is formed.

After the second semiconductor chip 22 is attached on the spacer 72, the bonding wire 42 electrically interconnecting the second semiconductor chip 22 and the lead 120 may be formed. Furthermore, although not shown, a bonding wire may be selectively formed between the second semiconductor chip 22 and the assistant semiconductor chip 30.

Figure 25:
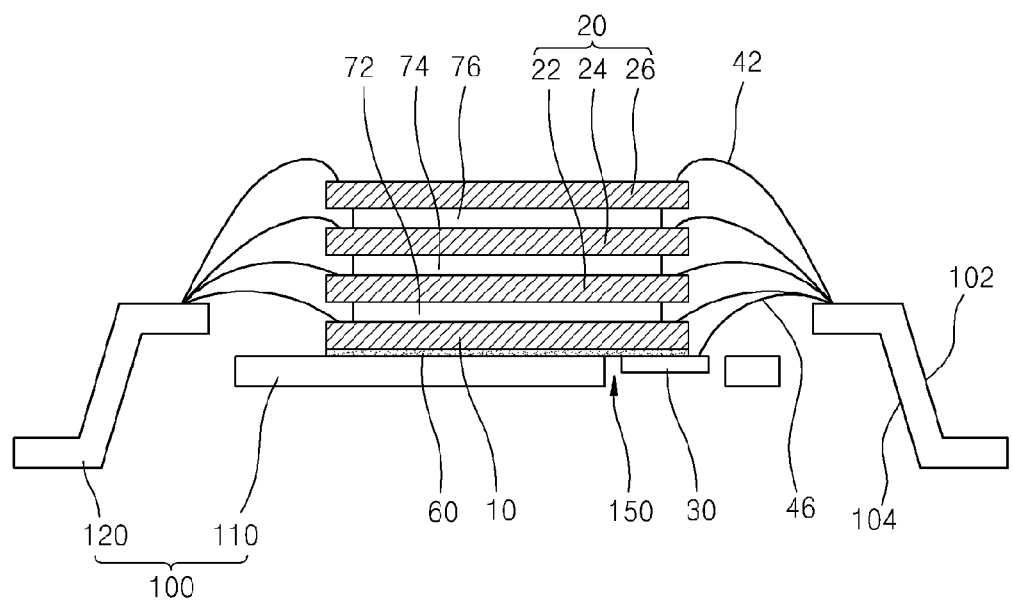

FIG. 25 is a sectional view showing processes of forming a plurality of second semiconductor chips and bonding wires for electrically interconnecting the plurality of second semiconductor chips and leads.

Referring to FIG. 25, a plurality of the spacers 72 as described in FIG. 24 and a plurality of second semiconductor chips 22 may be alternately attached to each other, so that a plurality of spacers 72, 74, and 76 and the plurality of second semiconductor chips 22 may be stacked on the first semiconductor chip 10. The first semiconductor chip 10 and the plurality of second semiconductor chips 22 may be stacked vertically on substantially the same center axis.

Figure 26:
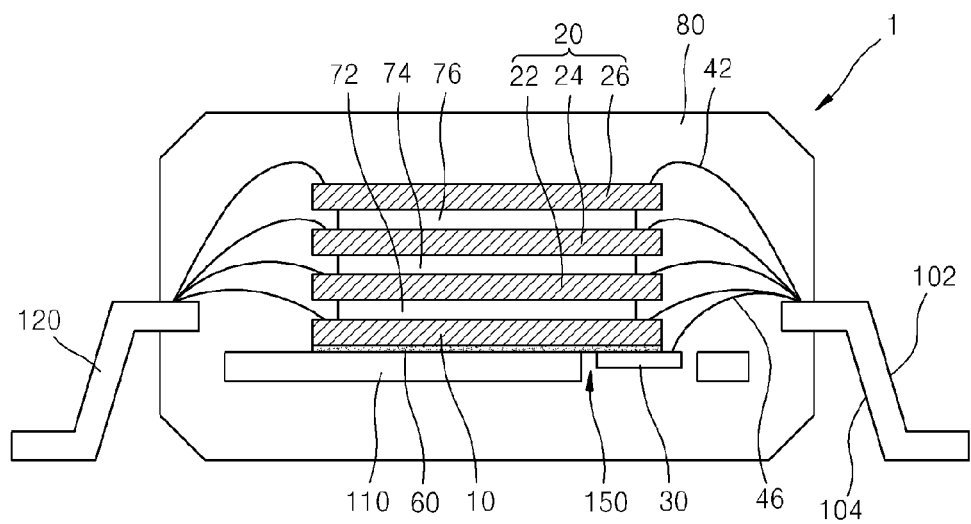

FIG. 26 is a sectional view of a semiconductor package 1 according to some embodiments.

Referring to FIG. 26, the semiconductor package 1 is formed by forming a molding layer 80 encapsulating the first semiconductor chip 10, the second semiconductor chip 20, the assistant semiconductor chip 30, the die paddle 110, the bonding wires 42 and 46, and a portion of the lead 120. The molding layer 80 may be formed of an epoxy molding compound (EMC), for example.

Although a plurality of semiconductor chips may be stacked in a cascaded shape in semiconductor packages according to previous embodiments as shown in FIGS. 10 through 20, a plurality of semiconductor chips may alternatively be stacked vertically on substantially the same center axis, such that the plurality of semiconductor chips are vertically aligned, in a semiconductor package according to some embodiments as shown in FIGS. 21 through 26.

Accordingly, the semiconductor package 1 including a plurality of semiconductor chips stacked vertically may employ the assistant semiconductor chip 30 without increasing the overall thickness and overall volume of the semiconductor package 1.

FIGS. 27 through 30 are sectional views of a semiconductor package according to another embodiment of the inventive concept and a method of fabricating the same.

Figure 27:
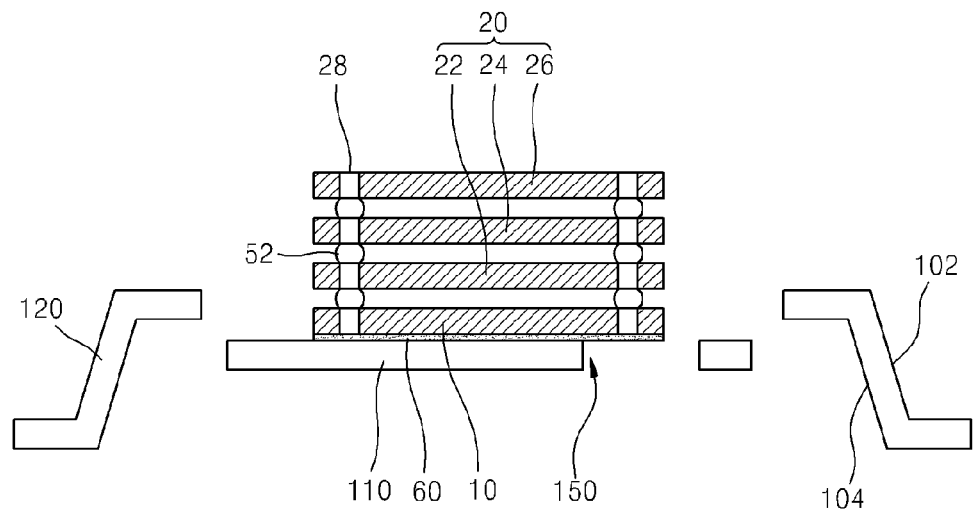
FIGS. 27 through 30 are sectional views of a semiconductor package according to a fifth embodiment of the inventive concept and a method of fabricating the same.

FIG. 27 is a sectional view showing processes of stacking a first semiconductor chip and a second semiconductor chip for fabricating a semiconductor package according to some embodiments.

Referring to FIG. 27, the first semiconductor chip 10 and the at least one second semiconductor chip 20 are stacked on the first surface 102 of the die paddle 110. The first semiconductor chip 10 may be attached on the die paddle 110 through the adhesive layer 60. The first semiconductor chip 10 may be attached on the die paddle 110 to partially cover the opening 150. The first semiconductor chip 10 and the plurality of second semiconductor chips 22, 24, and 26 may be stacked vertically on substantially the same center axis.

Each of the first semiconductor chip 10 and the second semiconductor chip 20 may be electrically connected to each other using through electrodes or through-silicon-vias (TSVs) 28, which penetrate the first semiconductor chip 10 and the plurality of second semiconductor chips 22, 24, and 26. Furthermore, the first semiconductor chip 10 and the plurality of second semiconductor chips 22, 24, and 26 may further include conductive inter-chip bumps 52 formed between each of the through electrodes or TSVs 28. Accordingly, the first semiconductor chip 10 and the plurality of second semiconductor chips 22, 24, and 26 may be electrically connected to each other without a bonding wire.

Figure 28:
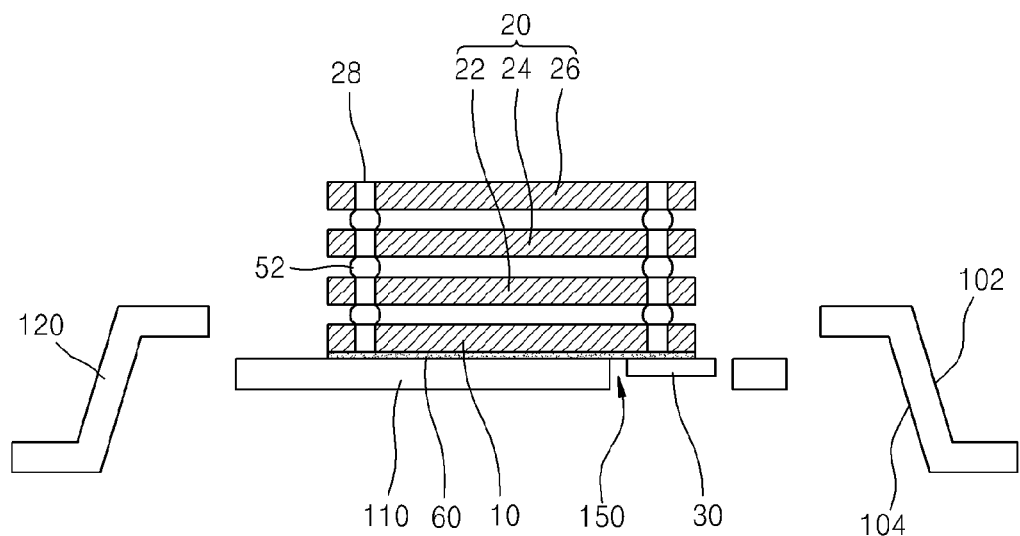

FIG. 28 is a sectional view showing processes of attaching an assistant semiconductor chip for fabricating a semiconductor package according to some embodiments.

Referring to FIG. 28, the assistant semiconductor chip 30 may be attached on the first semiconductor chip 10 through the opening 150. In other words, the assistant semiconductor chip 30 may be attached on a surface of the first semiconductor chip 10 facing the die paddle 110.

In this case, the assistant semiconductor chip 30 may be attached on the first semiconductor chip 10 through the adhesive layer 60, which is attached on the back surface of the first semiconductor chip 10 exposed through the opening 150. Therefore, the assistant semiconductor chip 30 may be attached on the first semiconductor chip 10 without a separate adhesive material.

The assistant semiconductor chip 30 may be arranged to extend between a portion of the opening 150 exposed by the first semiconductor chip 10 and a portion of the opening 150 covered by the first semiconductor chip 10. In other words, the assistant semiconductor chip 30 may be arranged such that the assistant semiconductor chip 30 is partially exposed through the opening 150.

Figure 29:
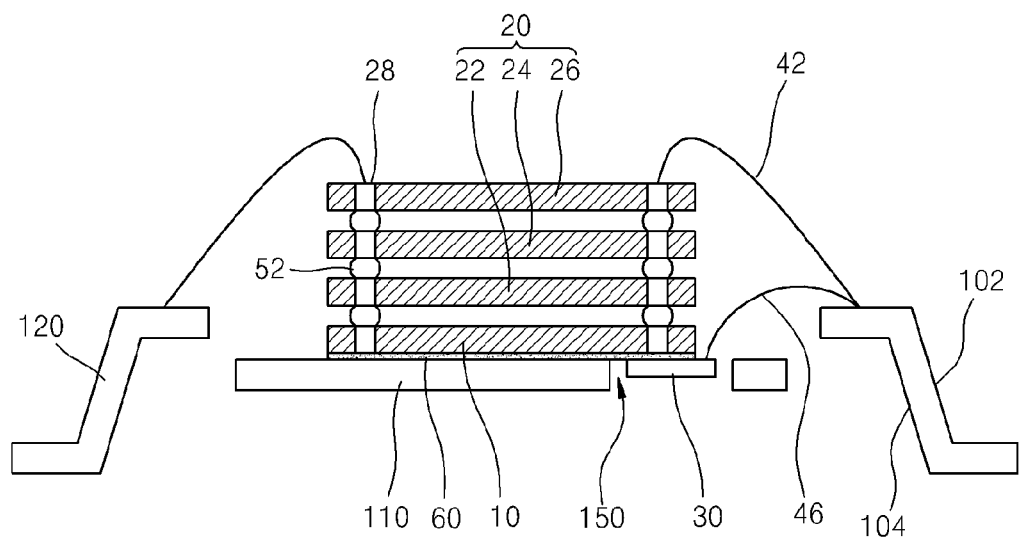

FIG. 29 is a sectional view showing processes of forming bonding wires for fabricating a semiconductor package according to some embodiments.

Referring to FIG. 29, the first semiconductor chip 10, the at least one second semiconductor chip 20, the assistant semiconductor chip 30, and the lead 120 are electrically connected to each other through the bonding wires 44 and 46. Both of the bonding wires 42 and 46 may be formed on the same surface of the lead frame 100, that is, the first surface 102. The bonding wire 42 connected to the at least one second semiconductor chips 20 and the bonding wire 46 connected to the leads 120 are electrically connected to each other through the leads 120, and thus the first semiconductor chip 10, the at least one second semiconductor chip 20, and the assistant semiconductor chip 30 may be electrically connected to each other.

Figure 30:
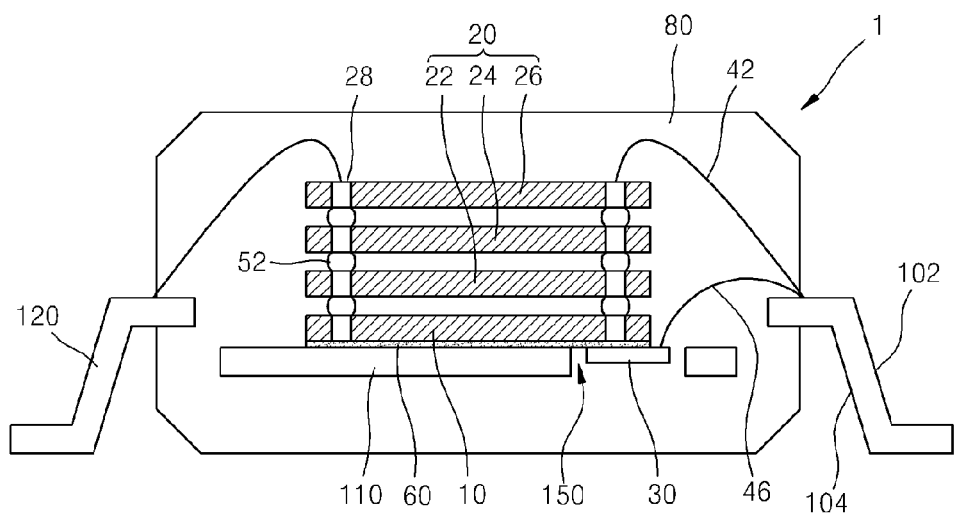

FIG. 30 is a sectional view of a semiconductor package 1 according to some embodiments.

Referring to FIG. 30, the semiconductor package 1 is formed by forming a molding layer 80 encapsulating the first semiconductor chip 10, the at least one second semiconductor chip 20, the assistant semiconductor chip 30, the die paddle 110, the bonding wires 42 and 46, and a portion of the lead 120. The molding layer 80 may be formed of an epoxy molding compound (EMC), for example.

The semiconductor package 1 including a plurality of semiconductor chips through which through electrodes 28 are formed may employ the assistant semiconductor chip 30 without increasing the overall thickness and overall volume of the semiconductor package 1.

FIGS. 31 through 34 are sectional views of a semiconductor package according to another embodiment of the inventive concept and a method of fabricating the same.

Figure 31:
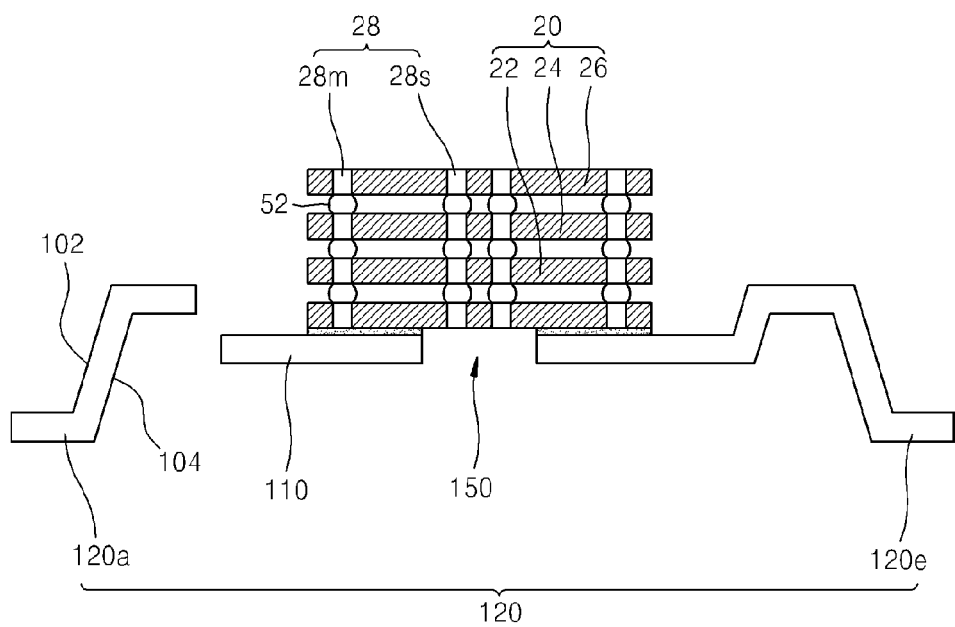
FIGS. 31 through 34 are sectional views of a semiconductor package according to a sixth embodiment of the inventive concept and a method of fabricating the same.

FIG. 31 is a sectional view showing processes of stacking a first semiconductor chip and an at least one second semiconductor chip for fabricating a semiconductor package according to some embodiments.

Referring to FIG. 31, the first semiconductor chip 10 and the at least one second semiconductor chip 20 are attached on the first surface 102 of the die paddle 110, in which the opening 150 is formed. The first semiconductor chip 10 may be attached on the die paddle 110 through the adhesive layer 60. The first semiconductor chip 10 may be attached on the die paddle 110 to completely cover the opening 150.

The first semiconductor chip 10 and the plurality of second semiconductor chips 22, 24, and 26 may be stacked vertically on substantially the same center axis. Each of the first semiconductor chip 10 and the second semiconductor chip 20 may be electrically connected to each other using the through electrodes 28, which include first through electrodes or first through-silicon-vias (TSVs) 28m and assistant through electrodes 28s. Furthermore, the first semiconductor chip 10 and the second semiconductor chips 20 may further include the conductive inter-chip bumps 52 formed between each of the first through electrodes or first TSVs 28.

Figure 32:
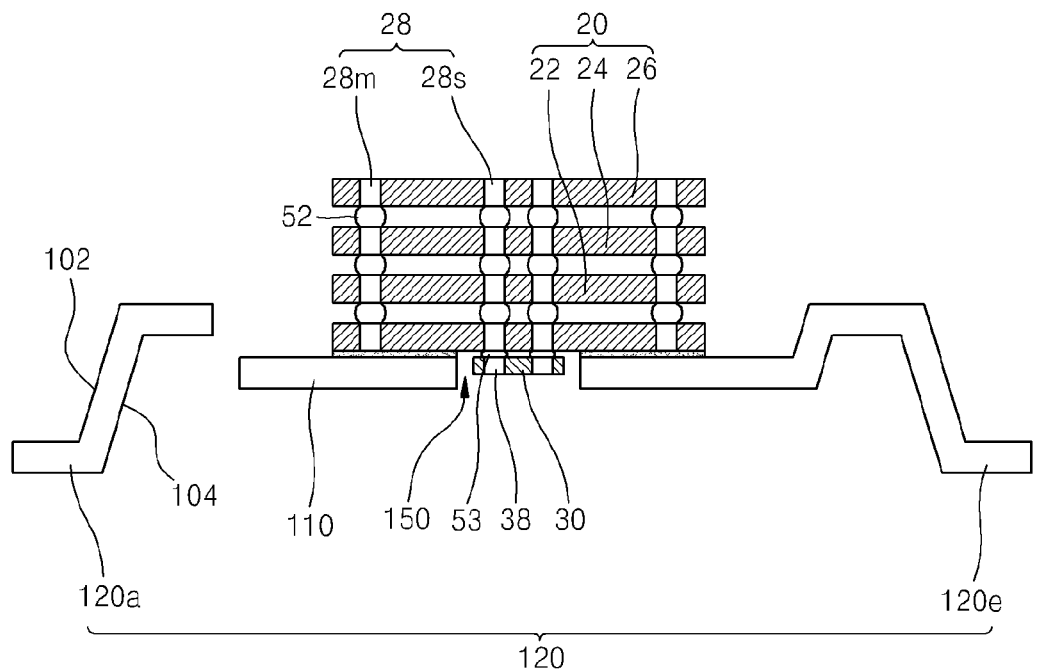

FIG. 32 is a sectional view showing processes of attaching an assistant semiconductor chip for fabricating a semiconductor package according to some embodiments.

Referring to FIG. 32, the assistant semiconductor chip 30 may be attached on the first semiconductor chip 10 through the opening 150. In other words, the assistant semiconductor chip 30 may be attached on a surface of the first semiconductor chip 10 facing the die paddle 110.

The assistant semiconductor chip 30 may be electrically connected to the first semiconductor chip 10 through the bumps 52. The active surface of the assistant semiconductor chip 30 may be opposite to the surface facing the first semiconductor chip 10. The assistant semiconductor chip 30 may include second through electrodes 38 penetrating the assistant semiconductor chip 30.

The assistant semiconductor chip 30 may be attached on the first semiconductor chip 10, such that the assistant through electrodes 28s and the second through electrodes 38 correspond to each other. Here, bumps 53 may be interposed between the assistant through electrodes 28s of the first semiconductor chip 10 and the second through electrodes 38 of the assistant semiconductor chip 30, and thus the first semiconductor chip 10 and the assistant semiconductor chip 30 are electrically connected to each other. In other words, the first semiconductor chip 10, the second semiconductor chips 20, and the assistant semiconductor chip 30 may be electrically connected to each other through the assistant through electrodes 28s and the second through electrodes 38.

Figure 33:
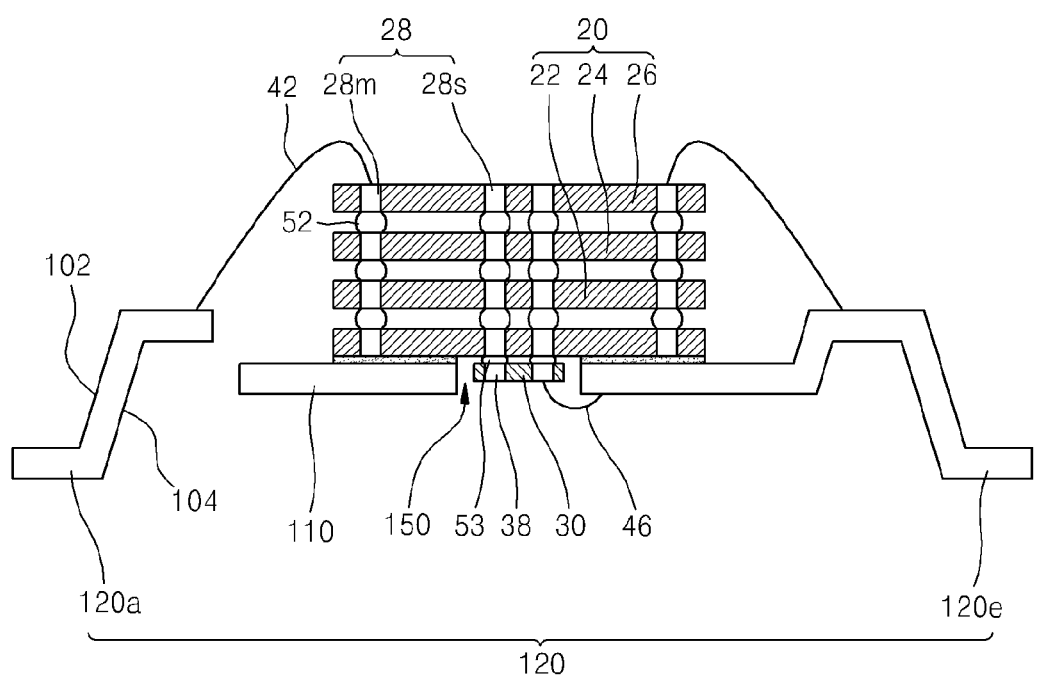

FIG. 33 is a sectional view showing processes of forming bonding wires for fabricating a semiconductor package according to some embodiments.

Referring to FIG. 33, the bonding wires 42 and 46 are formed for electrically interconnecting the second semiconductor chips 20 and the short lead 120a and for electrically interconnecting the assistant semiconductor chip 30 and the long lead 120e, respectively.

Where the first semiconductor chip 10, the at least one second semiconductor chip 20, and the assistant semiconductor chip 30 are electrically connected to each other using the first through electrodes 28 and the second through electrodes 38, either the bonding wire 42 electrically interconnecting the second semiconductor chips 20 and the short lead 120a, or the bonding wire 46 electrically interconnecting the assistant semiconductor chip 30 and the long lead 120e may be omitted.

Figure 34:
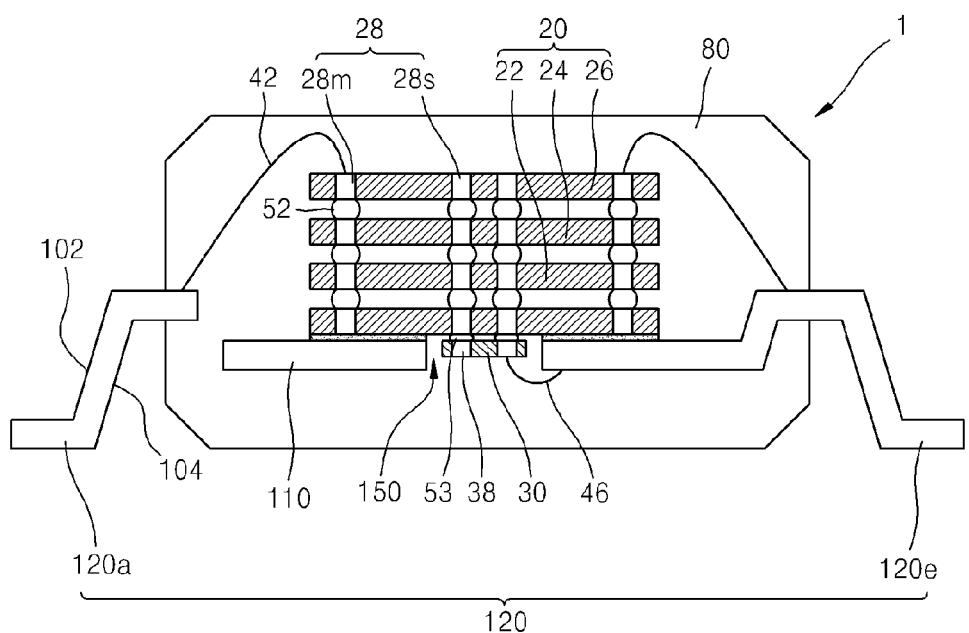

FIG. 34 is a sectional view of a semiconductor package 1 according to some embodiments.

Referring to FIG. 34, the semiconductor package 1 may be formed by forming a molding layer 80 encapsulating the first semiconductor chip 10, the at least one second semiconductor chip 20, the assistant semiconductor chip 30, the die paddle 110, the bonding wires 42 and 46, and a portion of the lead 120. The molding layer 80 may be formed of an epoxy molding compound (EMC), for example.

FIGS. 35 through 38 are sectional views of a semiconductor package according to another embodiment of the inventive concept and a method of fabricating the same.

Figure 35:
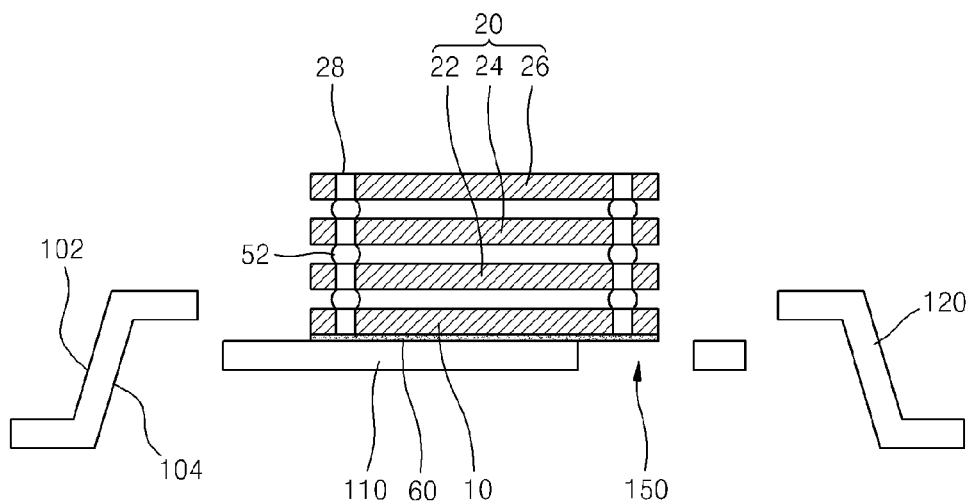
FIGS. 35 through 38 are sectional views of a semiconductor package according to a seventh embodiment of the inventive concept and a method of fabricating the same.

FIG. 35 is a sectional view showing processes of stacking a first semiconductor chip and an at least one second semiconductor chip for fabricating a semiconductor package according to some embodiments.

Referring to FIG. 35, the first semiconductor chip 10 and the at least one second semiconductor chip 20 are attached on the first surface 102 of the die paddle 110, in which the opening 150 is formed. The first semiconductor chip 10 may be attached on the die paddle 110 through the adhesive layer 60. The first semiconductor chip 10 may be attached on the die paddle 110 to partially cover the opening 150. The first semiconductor chip 10 and the plurality of second semiconductor chips 22, 24, and 26 may be stacked vertically on substantially the same center axis.

Each of the first semiconductor chip 10 and the at least one second semiconductor chip 20 may be electrically connected to each other through the through electrodes 28. Furthermore, the first semiconductor chip 10 and the at least one second semiconductor chip 20 may further include the conductive inter-chip bumps 52 formed between each of the through electrodes 28.

Figure 36:
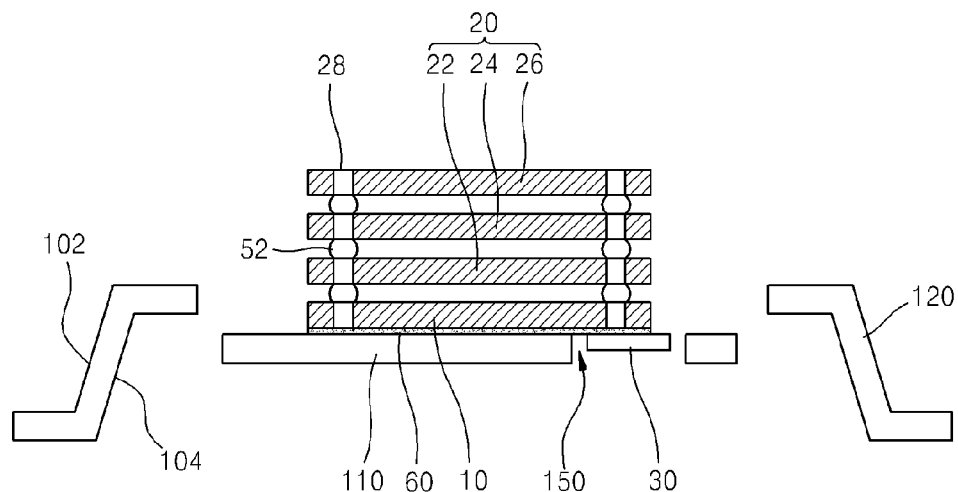

FIG. 36 is a sectional view showing processes of attaching an assistant semiconductor chip for fabricating a semiconductor package according to some embodiments.

Referring to FIG. 36, the assistant semiconductor chip 30 may be attached on the first semiconductor chip 10 through the opening 150. In other words, the assistant semiconductor chip 30 may be attached on an exposed surface of the first semiconductor chip 10 facing the die paddle 110 through the opening 150.

In this case, the assistant semiconductor chip 30 may be attached on the first semiconductor chip 10 through the adhesive layer 60, which is attached on the back surface of the first semiconductor chip 10 exposed in the opening 150. Therefore, the assistant semiconductor chip 30 may be attached on the first semiconductor chip 10 without a separate adhesive material.

The assistant semiconductor chip 30 may be arranged to extend between a portion of the opening 150 exposed by the first semiconductor chip 10 and a portion of the opening 150 covered by the first semiconductor chip 10. In other words, the assistant semiconductor chip 30 may be arranged such that the assistant semiconductor chip 30 is partially exposed through the opening 150.

Figure 37:
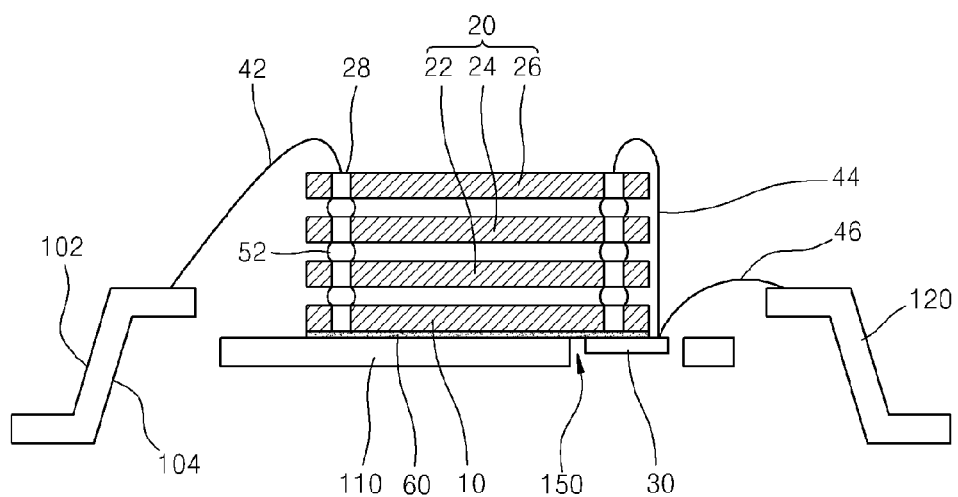

FIG. 37 is a sectional view showing processes of forming bonding wires for fabricating a semiconductor package according to some embodiments.

Referring to FIG. 37, the first semiconductor chip 10, the at least one second semiconductor chips 20, the assistant semiconductor chip 30, and the leads 120 are electrically connected to each other through the bonding wires 42, 44, and 46. All of the bonding wires 42, 44, and 46 may be formed on the same surface of the lead frame 100, that is, the first surface 102.

Although the at least one second semiconductor chips 20 and the assistant semiconductor chip 30 are connected through the leads 120 without directly interposing a bonding wire therebetween in the previous embodiment shown in FIG. 29, a second bonding wire 44 directly interconnecting the at least one second semiconductor chips 20 and the assistant semiconductor chip 30 may be additionally formed in the embodiment shown in FIG. 37.

Accordingly, the electrical connections between the first semiconductor chip 10, the at least one second semiconductor chips 20, and the assistant semiconductor chip 30 are not limited to the electrical connections described above, and bonding wires may be connected in any of various shapes as long as necessary electrical connections and performance thereof may be acquired.

Figure 38:
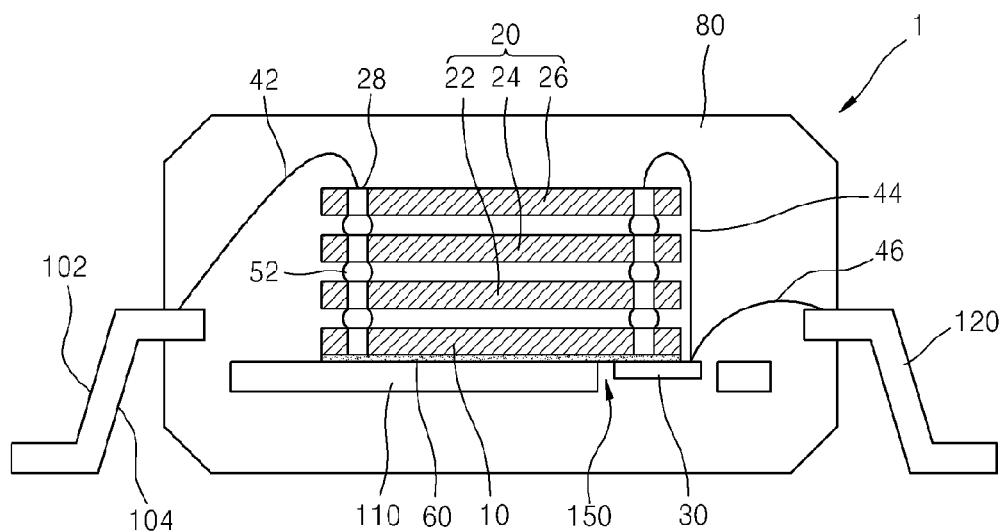

FIG. 38 is a sectional view of a semiconductor package 1 according to some embodiments.

Referring to FIG. 38, the semiconductor package 1 is formed by forming a molding layer 80 encapsulating the first semiconductor chip 10, the at least one second semiconductor chip 20, the assistant semiconductor chip 30, the die paddle 110, the bonding wires 42, 44, and 46, and a portion of the lead 120. The molding layer 80 may be formed of an epoxy molding compound (EMC), for example.

Figure 39:
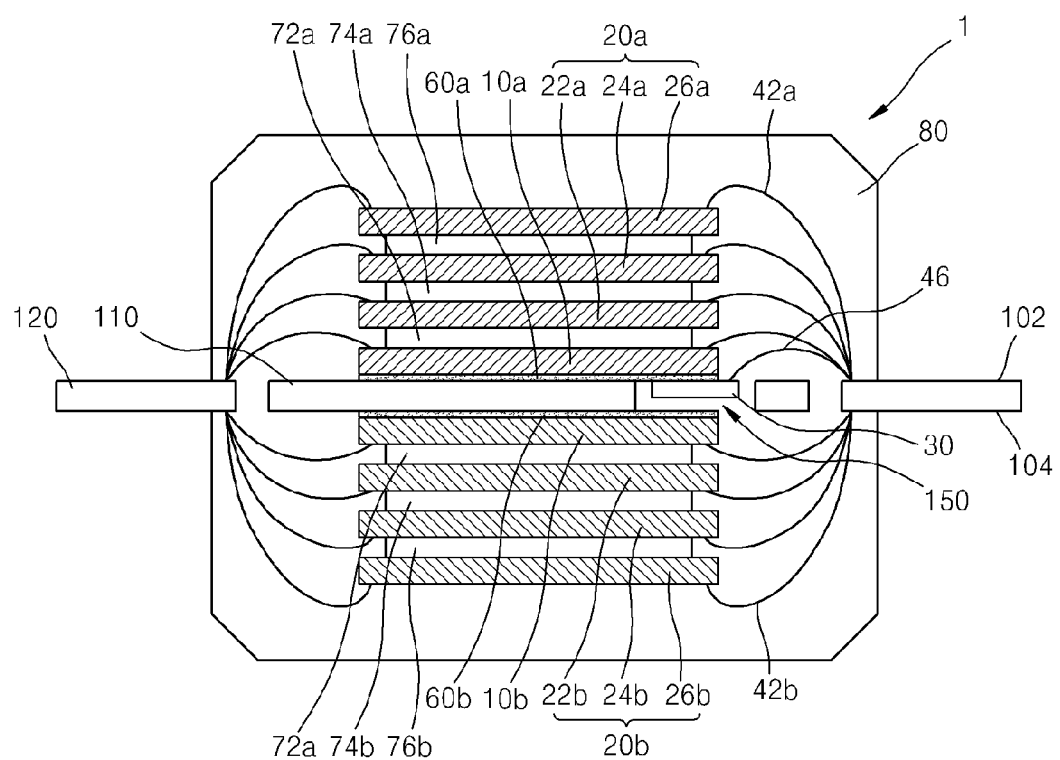
FIG. 39 is a sectional view of a semiconductor package according to an eighth embodiment of the inventive concept.

FIG. 39 is a sectional view of a semiconductor package 1 according to another embodiment of the inventive concept.

Referring to FIG. 39, the semiconductor package 1 includes a first semiconductor chip 10a, at least one second semiconductor chip 20a, a third semiconductor chip 10b, and at least one fourth semiconductor chip, which are stacked on two opposite surfaces of the die paddle 110. In this case, the assistant semiconductor chip 30 may perform functions for guaranteeing data, maximizing lifespan, and improving performance with respect to not only the first semiconductor chip 10a and the at least one second semiconductor chip 20a, which are stacked on the first surface 102 of the die paddle 110, but also the third semiconductor chip 10b and the at least one fourth semiconductor chip 20b, which are stacked on the second surface 104 of the die paddle 110.

There may be several difficulties for stacking a large number of semiconductor chips on a same surface of a lead frame, such as problem associated with the connections of bonding wires. In such cases, a plurality of semiconductor chips may be stacked on two opposite surfaces of a lead frame and the same assistant semiconductor chip 30 may control the semiconductor chips. Such a semiconductor package 1, in which a plurality of semiconductor chips are stacked on two opposite surfaces of a lead frame, may employ the assistant semiconductor chip 30 without increasing the overall thickness of the semiconductor package 1.

Although FIG. 39 shows a modification of the semiconductor package 1 according to the previous embodiment as shown in FIG. 26, in which semiconductor chips are stacked on two opposite surfaces of a lead frame, the semiconductor packages 1 according to the previous embodiments as shown in FIGS. 14, 20, 30, and 38 may also be modified, such that semiconductor chips are stacked on two opposite surfaces of a lead frame.

Figure 40:
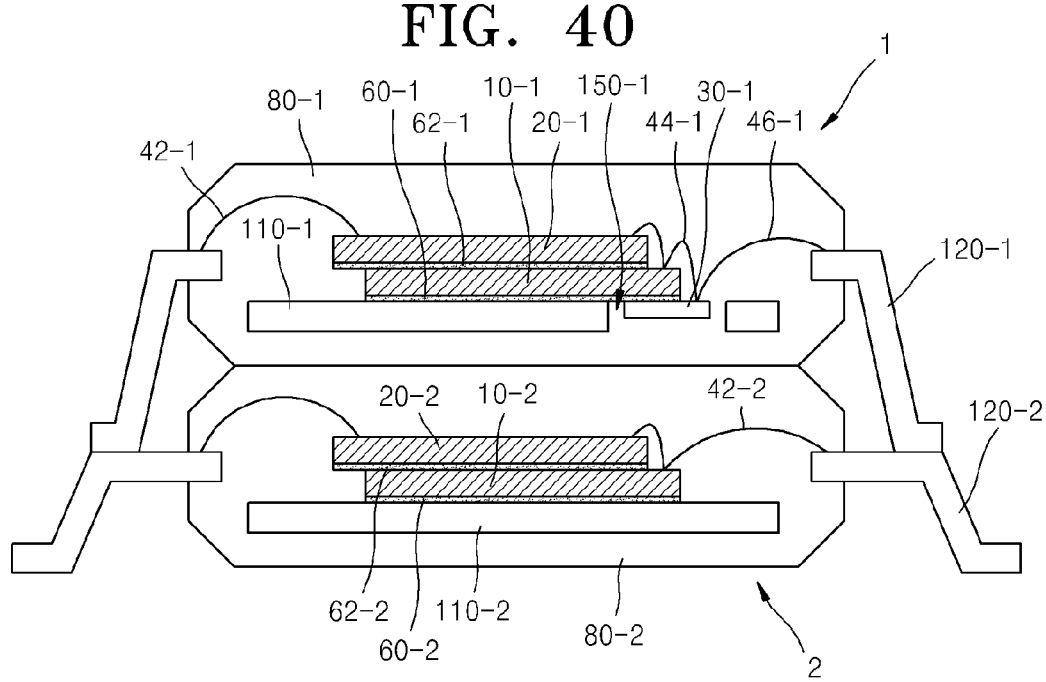
FIG. 40 is a sectional view of a semiconductor package according to a ninth embodiment of the inventive concept.

FIG. 40 is a sectional view of a semiconductor package according to another embodiment of the inventive concept.

Referring to FIG. 40, the semiconductor package includes a first semiconductor package 1 and a second semiconductor package 2.

The first semiconductor package 1 includes a first lead frame, which includes a first die paddle 110-1, in which a first opening 150-1 is formed, and a plurality of first leads 120-1, which are arranged around the first die paddle 110-1. A first semiconductor chip 10-1 is attached on the first die paddle 110-1 and may cover at least a portion of the first opening 150-1. Furthermore, at least one second semiconductor chip 20-1 may be stacked on the first semiconductor chip 10-1. A first assistant semiconductor chip 30-1 may be attached on the first semiconductor chip 10-1 through the first opening 150-1. Furthermore, the first die paddle 110-1, the first semiconductor chip 10-1, the at least one second semiconductor chip 20-1, the first assistant semiconductor chip 30-1, and a part of the first leads 120-1 may be encapsulated by a first molding layer 80-1.

The first opening 150-1, the first die paddle 110-1, the first leads 120-1, the first assistant semiconductor chip 30-1, and the first molding layer 80-1, which are included in the first package 1, may also be referred to as an opening 150-1, a die paddle 110-1, leads 120-1, an assistant semiconductor chip 30-1, and a molding layer 80-1, respectively.

The second semiconductor package 2 includes a second lead frame, which includes a second die paddle 110-2 and a plurality of second leads 120-2, which are arranged around the second die paddle 110-2. A third semiconductor chip 10-2 is attached on the second die paddle 110-2, and at least one fourth semiconductor chip 20-2 may be stacked on the third semiconductor chip 10-2. The second die paddle 110-2, the third semiconductor chip 10-2, the at least one fourth semiconductor chip 20-2, and a part of the second leads 120-2 may be surrounded by a second molding layer 80-2.

The first package 1 and the second package 2 may be a package-on-package (PoP), functioning as a single semiconductor package, in which the first leads 120-1 contact the second leads 120-2.

When a semiconductor package is fabricated as a PoP, a part of the semiconductor chips included in the semiconductor package may be formed as a partial package and it may be checked whether the partial package is a known-good-package (KGP) or not. Therefore, a number of good semiconductor chips that are formed as a package with defective semiconductor chips and are needlessly disposed may be reduced. Therefore, the yield of fabricating semiconductor packages can be substantially improved.

Although FIG. 40 shows that the first package 1 includes two semiconductor chips 10-1 and 20-1, the first package 1 may be replaced with any of the semiconductor packages 1 according to the previous embodiments shown in FIGS. 6 through 9, 14, 20, 30, 34, 38, and 39.

Furthermore, although FIG. 40 shows that each of the first package 1 and the second package 2 includes two semiconductor chips 10-1 and 20-1 or 10-2 and 20-2, the first package 1 and the second package 2 may include any number of semiconductor chips.

Although the first package 1 includes the first assistant semiconductor chip 30-1, the second package 2 may not include any assistant semiconductor chip. In this case, all semiconductor chips included in the first package 1 and the second package 2, that is, the first through fourth semiconductor chips 10-1, 20-1, 10-2, and 20-2 may both be controlled by the first assistant semiconductor chip 30-1.

Where the first through fourth semiconductor chips 10-1, 20-1, 10-2, and 20-2 are NAND flash memory chips, the first assistant semiconductor chip 30-1 may be a controller chip such as a semiconductor chip for performing wearing-leveling, error correcting code (ECC), or defective block control for the first through fourth semiconductor chips 10-1, 20-1, 10-2, and 20-2. In other words, the first assistant semiconductor chip 30-1 may be a semiconductor chip for performing functions for guaranteeing data, maximizing lifespan, and improving performance of the first through fourth semiconductor chips 10-1, 20-1, 10-2, and 20-2.

FIG. 41 is a sectional view of a semiconductor package according to another embodiment of the inventive concept.

Referring to FIG. 41, the semiconductor package includes a first package 1*a* and a second package 1*b*. Unlike the second package 2 shown in FIG. 40, the second package 1*b* shown in FIG. 41 includes a separate second assistant semiconductor chip 30*b*. Therefore, a second die paddle 110*b* of the second package 1*b* includes a second opening 150*b*.

The first package 1*a* and the second package 1*b* may be replaced with any of the semiconductor packages 1 according to the previous embodiments shown in FIGS. 6 through 9, 14, 20, 30, 34, 38, and 39.

In other words, the first semiconductor chip 10*a* and the at least one second semiconductor chip 20*a*, included in the first package 1*a*, and the third semiconductor chip 10*b* and the at least one fourth semiconductor chip 20*b*, included in the second package 1*b*, may be controlled by separate assistant semiconductor chips, that is, a first assistant semiconductor chip 30*a* and a second assistant semiconductor chip 30*b*.

A portion of a first lead 120*a* of the first package 1*a* may be broken and form a first broken portion 120*a*-X. Furthermore, although not shown, a second lead 120*b* of the second package 1*b* may also be broken and form a second broken portion (not shown). The second lead 120*b*, which contacts the first lead 120*a* on which the first broken portion 120*a*-X is formed, may still electrically interconnect the second package 1*b* and outside regardless of whether the first package 1*a* has a first broken portion 120*a*-X. On the contrary, the first lead 120*a*, which contacts the second lead 120*b* on which the second broken portion is formed, may still electrically interconnect the first package 1*a* and an external device regardless of the second package 1*b* having the second broken portion.

Here, although FIG. 41 shows that a bonding wire 46*a* formed between the first assistant semiconductor chip 30*a* and the first lead 120*a* is connected to the first lead 120*a* on which the first broken portion 120*a*-X is formed for convenience of explanation, the inventive concept is not limited thereto.

In other words, just as a bonding wire 46*b* formed between the second assistant semiconductor chip 30*b* and the second lead 120*b* is connected to the unbroken second lead 120*b*, the bonding wire 46*a* formed between the first assistant semiconductor chip 30*a* and the first lead 120*a* may be connected to an adjacent unbroken first lead 120*a* (not illustrated).

FIG. 42 is a sectional view of a semiconductor package 3 according to another embodiment of the inventive concept.

Referring to FIG. 42, the semiconductor package 3 includes a printed circuit board (PCB) 200. The PCB 200 includes an insulation layer 210, in which an opening 250 is formed, conductive wirings 220, which are formed in and on the top surface 212 and the bottom surface 214 of the insulation layer 210, and a conductive layer such as a metal layer 230. The metal layer 230 is formed in the insulation layer 210 and selectively interconnects conductive wirings 222 and 224 that are formed on the top surface 212 and the bottom surface 214 of the insulation layer 210.

The insulation layer 210 may be formed of epoxy resin, polyimide resin, Bismaleimide-Triazine (BT), flame retardant 4 (FR-4), FR-5, ceramic, silicon, or glass, for example.

A part of the conductive wirings 222 formed on the top surface 212 of the insulation layer 210 may be bonding pads or bond fingers. Furthermore, a part of the conductive wirings 224 formed on the bottom surface 214 of the insulation layer 210 may be solder ball pads. Conductive balls such as solder balls 240 may be attached on the solder ball pads.

Furthermore, the semiconductor chip 10 may be attached on a semiconductor chip attaching region 200-C1 on the top surface 212 of the insulation layer 210 of the PCB 200 to partially cover the opening 250. Furthermore, the assistant semiconductor chip 30 is attached on the semiconductor chip 10 through the opening 250.

Referring to FIGS. 6 and 42, the semiconductor package 1 shown in FIG. 6 employs a lead frame including the die paddle 110 and the leads 120, whereas the semiconductor package 3 shown in FIG. 42 employs the PCB 200.

Therefore, the leads 120 to which the bonding wires 42, 44, and 46 are connected in the semiconductor package 1 shown in FIG. 6 may correspond to the bonding pads, which are a portion of the conductive wirings 222 formed on the top surface 212 of the insulation layer 210 in the semiconductor package 3 shown in FIG. 42.

Furthermore, the semiconductor package 1 shown in FIG. 6 may be connected to an external device through the leads 120, whereas the semiconductor package 3 shown in FIG. 42 may be connected to an external device through the solder balls 240.

Besides the differences as described above, the semiconductor package 1 shown in FIG. 6 and the semiconductor package 3 shown in FIG. 42 have various common features. Therefore, descriptions of the common features will be omitted.

The opening 250 of the PCB 200 included in the semiconductor package 3 shown in FIG. 42 is similar to the openings 150 of the lead frames 100*a* and 100*b* shown in FIGS. 1 and 2. However, a PCB having an opening similar to the openings 150 of the lead frames 100*c* and 100*d* shown in FIGS. 3 and 4 or other previous embodiments may also be applied to the semiconductor package 3.

Figure 43:
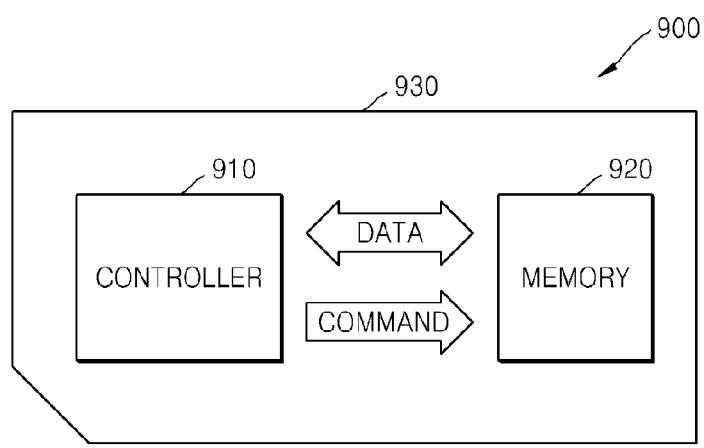
FIG. 43 is a block diagram of a memory card according to an embodiment of the inventive concept.

FIG. 43 is a block diagram of a memory card 900 according to an embodiment of the inventive concept.

Referring to FIG. 43, the memory card 900 may include a controller 910 and a memory 920, which are housed in a housing 930. The controller 910 and the memory 920 may exchange electric signals. For example, the memory 920 and the controller 910 may exchange data according to instructions of the controller 910. Therefore, the memory card 900 may store data in the memory 920 or output data to outside from the memory 920.

For example, the memory 920 and/or the controller may be included in any of the semiconductor packages described previously. The memory card 900 may be used as a data storage medium for various portable devices. For example, the memory card 900 may be a multimedia card (MMC) or a secure digital card (SD).

If any of the semiconductor packages described previously is used as the memory 920, the thickness or the volume of the memory card 900 may be reduced.

Figure 44:
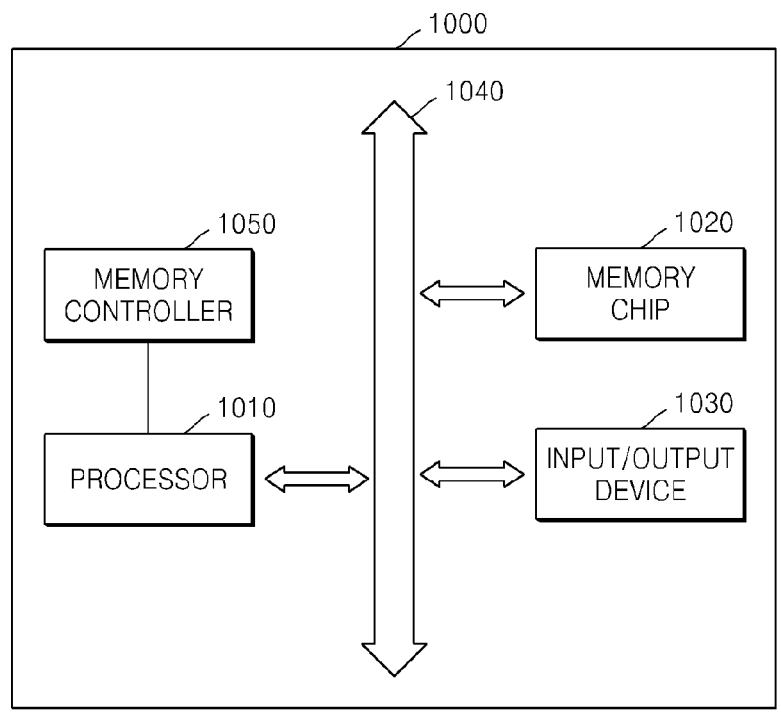
FIG. 44 is a block diagram of an electronic system according to an embodiment of the inventive concept.

FIG. 44 is a block diagram of an electronic system 1000 according to an embodiment of the inventive concept.

Referring to FIG. 44, the electronic system 1000 may include a processor 1010, an input/output device 1030, and a memory chip 1020, where the processor 1010, the input/output device 1030, and the memory chip 1020 may perform data communication with each other by using a bus 1040. The processor 1010 may execute a program and control the electronic system 1000. The input/output device 1030 may be used to input/output data to/from the electronic system 1000. The electronic system 1000 may be connected to an external device, e.g. a personal computer or a network, by using the input/output device 1030 and may exchange data with the external device. The memory chip 1020 may store codes or programs for operations of the processor 1010.

The electronic system 1000 may embody various electronic control systems requiring the memory 1020, and, for example, may be used in mobile phones, MP3 players, navigation devices, solid state disks/drives (SSD), or household appliances.

Where any of the previously-described semiconductor devices are used as the memory chip 1020, the thickness or the volume of the electronic system 1000 may be reduced.

According to some embodiments, the processor 1010 may be of any type including but not limited to a microprocessor (μP), a microcontroller (μC), a digital signal processor (DSP), or any combination thereof. The processor 1010 may include a processor core (not illustrated) that can include a floating point unit (FPU), an arithmetic logic unit (ALU), and a digital signal processing core (DSP Core), or any combination thereof. The processor 1010 may also include registers (not illustrated). A memory controller 1050 can also be used with the processor 1010, or the memory controller 1010 can be an internal part of the processor 1010 depending on applications.

For example, the memory chip 1020, the memory controller 1050 and/or the processor 1010 may include any of the semiconductor packages described with reference to FIGS. 6 through 9, 14, 20, 26, 30, 34, 38, 39, 40, 41, and 42.

The system 1000 may also include an interface bus (not separately illustrated) for facilitating communication from various interface devices (e.g., output interfaces, peripheral interfaces, and communication interfaces) to the system 1000. The output interfaces may be configured to communicate with various external devices such as a display or speakers. The peripheral interfaces may be configured to communicate with external devices or other peripheral devices such as printers, fax machines, scanners and so on.

According to some embodiments, a system may include a package comprising a package substrate having a first surface and a boundary defined by edges of the package substrate. The package further includes a first semiconductor chip having a front surface and a back surface. The back surface of a first portion of the first semiconductor chip is disposed on the first surface of the package substrate with the back surface of a second portion of the first semiconductor chip extending beyond of the defined boundary of the package substrate. In the package, the second semiconductor chip may be disposed on the back surface of the second portion of the first semiconductor chip that extends beyond the defined boundary of the package substrate. The system additionally includes an input/output device (e.g., keyboard, mouse, pen, voice input device, touch input device and so on) connected to the package.

The system 1000 may be implemented as a portion of a portable (or mobile) electronic device such as a personal media player device, a wireless web-watch device, a personal headset device, or a hybrid device that includes any of the above functions. In addition, the system 1000 may be implemented as part of a wireless base station or other wireless system or device.

Embodiments of the present application may also be applied to form ASICs, PLDs/Gate Arrays, DSPs, Graphics and PC chipsets. Also, embodiments of the present application can be used to form a storage device for notebook PCs and sub-notebooks for enterprises, Ultra-Mobile PCs (UMPC), and Tablet PCs.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
   a package substrate having a first surface and a boundary defined by edges of the package substrate;
   a first semiconductor chip having a front surface and a back surface, wherein the back surface of a first portion of the first semiconductor chip is disposed on the first surface of the package substrate with the back surface of a second portion of the first semiconductor chip extending beyond of the defined boundary of the package substrate; and
   a second semiconductor chip disposed on the back surface of the second portion of the first semiconductor chip that extends beyond the defined boundary of the package substrate, wherein a portion of the second semiconductor chip extends past the second portion of the first semiconductor chip.

2. The package of claim 1, wherein the package substrate comprises a die paddle of a lead frame.

3. The package of claim 1, wherein the package substrate comprises a PCB substrate.

4. A semiconductor package including:
a lead frame having a die paddle having a first surface and a defined boundary and a plurality of leads arranged around the die paddle;
a first semiconductor chip having a front surface and a back surface, the back surface of the first semiconductor chip disposed on the first surface of the die paddle so as to extend past the defined boundary of the die paddle; and
a second semiconductor chip disposed on the back surface of the first semiconductor chip in a portion of the first semiconductor chip extending past the defined boundary of the die paddle.

5. The package of claim 4, wherein the defined boundary of the die paddle surrounds a through hole formed through the die paddle, wherein the first semiconductor chip at least partially overlaps the hole.

6. The package of claim 4, wherein the defined boundary of the die paddle provides a notch arranged in a perimeter of the die paddle, and wherein the first semiconductor chip at least partially overlaps the notch.

7. The semiconductor package of claim 6, wherein at least a part of the plurality of leads extends into the notch.

8. A semiconductor package comprising:
a lead frame having a first surface and a second surface arranged opposite to each other, the lead frame comprising:
a die paddle having an opening extending therethrough, the die paddle having a first edge and a second edge opposite to the first edge; and
a plurality of leads arranged around the die paddle;
a first semiconductor chip overlying the first surface of the lead frame and covering at least a portion of the opening; and
an assistant semiconductor chip attached on the first semiconductor chip through the opening.

9. The semiconductor package of claim 8, wherein a thickness of the assistant semiconductor chip is smaller than or equal to a thickness of the die paddle.

10. The semiconductor package of claim 8, wherein an area of the top surface of the assistant semiconductor chip is smaller than an area of the top surface of the first semiconductor chip.

11. The semiconductor package of claim 8, wherein the assistant semiconductor chip is arranged to extend between a portion of the opening covered by the first semiconductor chip and another portion of the opening not covered by the first semiconductor chip.

12. The semiconductor package of claim 11, further comprising a bonding wire for electrically interconnecting a portion of the assistant semiconductor chip and one of the plurality of leads, wherein the assistant semiconductor chip is exposed through another portion of the opening not covered by the first semiconductor chip.

13. The semiconductor package of claim 8, wherein the opening is a through hole formed in the die paddle.

14. The semiconductor package of claim 13, wherein the opening is completely covered by the first semiconductor chip.

15. The semiconductor package of claim 8, wherein the opening extends from the first edge of the die paddle.

16. The semiconductor package of claim 8, further comprising at least one second semiconductor chip stacked on the first semiconductor chip.

17. The semiconductor package of claim 16, wherein the second semiconductor chip is stacked on and offset from the first semiconductor chip such that it extends past an edge of the first semiconductor chip, and such that at least a portion of the top surface of the first semiconductor chip is exposed.

18. The semiconductor package of claim 17, wherein a portion of the opening that is not covered by the first semiconductor chip is located on a side of the die paddle arranged opposite to a side of the die paddle in which the second semiconductor chip extends past the edge of the first semiconductor chip.

19. The semiconductor package of claim 16, wherein a plurality of the second semiconductor chips are sequentially stacked,
the semiconductor package further comprising a bonding wire, which electrically interconnects two adjacent semiconductor chips from among the first semiconductor chip and the plurality of second semiconductor chips, and a jumping bonding wire, which electrically interconnects two semiconductor chips arranged apart from each other from among the first semiconductor chip and the plurality of second semiconductor chips.

20. The semiconductor package of claim 16, wherein the first semiconductor chip and the second semiconductor chips are stacked vertically on substantially the same center axis.

21. The semiconductor package of claim 20, wherein the first semiconductor chip and the second semiconductor chips are connected to each other using through electrodes.

22. The semiconductor package of claim 21, wherein the first semiconductor chip and the second semiconductor chips further comprise assistant through electrodes, and
the first semiconductor chip and the second semiconductor chips are electrically connected to the assistant semiconductor chip through the assistant through electrodes.

23. The semiconductor package of claim 22, further comprising bumps interposed between the assistant through electrodes of the first semiconductor chip and the assistant chip.

24. The semiconductor package of claim 16, further comprising:
a third semiconductor chip, which is attached on a surface of the die paddle opposite to the surface of the die paddle on which the first semiconductor chip is attached; and
at least one fourth semiconductor chip stacked on the third semiconductor chip.

25. The semiconductor package of claim 16, wherein the first semiconductor chip and the second semiconductor chips are flash memory chips, and
wherein the assistant semiconductor chip is a controller.

26. The semiconductor package of claim 25, wherein the controller performs at least one function selected from the functions including wearing-leveling, error correcting code (ECC), and defective block control for the first semiconductor chip and the second semiconductor chip.

27. The semiconductor package of claim 26, wherein the first semiconductor chip and the second semiconductor chip are multi level cell (MLC) NAND flash memory chips.

28. A semiconductor package, comprising:
a first package comprising:
a first lead frame having a first surface and a second surface opposite to each other, the lead frame further comprising: a die paddle, in which an opening is formed, having a first edge and a second edge opposite to the first edge; and a plurality of leads arranged around the die paddle;
a first semiconductor chip, which is attached on the die paddle on the first surface of the lead frame and covers at least a portion of the opening; and
an assistant semiconductor chip attached on the first semiconductor chip through the opening;
at least one second semiconductor chip stacked on the first semiconductor chip; and a first molding layer, which surrounds the first lead frame, the first semiconductor chip, the assistant semiconductor chip, and the at least one second semiconductor chip; and a second package comprising:
  a second lead frame having a second die paddle; and a plurality of second leads arranged around the second die paddle;
  a third semiconductor chip attached on the second die paddle;
  at least one fourth semiconductor chip stacked on the third semiconductor chip; and
  a second molding layer, which surrounds the second die paddle, the third semiconductor chip, and the at least one fourth semiconductor chip, wherein at least a part of the first leads of the first package contact at least a part of the second leads of the second package, so that the first package and the second package are electrically connected to each other.

29. The semiconductor package of claim 28, wherein a second opening is formed in the second die paddle, and
  the third semiconductor chip is attached on the second die paddle to cover at least a portion of the second opening, further comprising a second assistant semiconductor chip, which is attached on the third semiconductor chip through the second opening.

* * * * *